(12) United States Patent
Farsiabi et al.

(10) Patent No.: US 12,107,605 B1
(45) Date of Patent: Oct. 1, 2024

(54) APPLICATION-SPECIFIC HARDWARE DEVICE FOR DECODING NON-BINARY POLAR CODES

(71) Applicant: HUAWEI TECHNOLOGIES CO., LTD., Guangdong (CN)

(72) Inventors: Ali Farsiabi, Kanata (CA); Hamid Ebrahimzad, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/126,798

(22) Filed: Mar. 27, 2023

(51) Int. Cl.
*H03M 13/13* (2006.01)

(52) U.S. Cl.
CPC .................................. *H03M 13/13* (2013.01)

(58) Field of Classification Search
CPC ................................................... H03M 13/13
See application file for complete search history.

(56) References Cited

U.S. PATENT DOCUMENTS

| | | | | |
|---|---|---|---|---|
| 2020/0220652 | A1* | 7/2020 | Son | H04L 1/0054 |
| 2021/0328716 | A1* | 10/2021 | Noh | H04W 4/46 |
| 2021/0351796 | A1* | 11/2021 | Fujimori | H03M 13/45 |

OTHER PUBLICATIONS

Arikan, "Channel polarization: A method for constructing capacity achieving codes for symmetric binary-input memoryless channels", IEEE Trans. Inf. Theory, vol. 55, No. 7, Jul. 2009, pp. 3051-3073.

Sarkis et al., "Fast polar decoders: Algorithm and implementation", IEEE J. Sel. Areas Commun., vol. 32, No. 5, May 2014, pp. 946-957.

Hanif et al., "Fast successive-cancellation decoding of polar codes: Identification and decoding of new nodes", IEEE Commun. Lett., vol. 21, No. 11, Nov. 2017, pp. 2360-2363.

Hashemi et al., "Simplified successive cancellation list decoding of polar codes," in IEEE Int. Symp. on Inform. Theory, Jul. 2016, pp. 815-819.

Alamdar-Yazdi et al., "A simplified successive cancellation decoder for polar codes", IEEE Commun. Lett., vol. 15, No. 12, Dec. 2011, pp. 1378-1380.

Zheng et al., "Threshold-Based Fast Successive-Cancellation Decoding of Polar Codes", IEEE Transactions on Communications, vol. 69, No. 6, Jun. 2021, pp. 3541-3555.

(Continued)

*Primary Examiner* — Thien Nguyen
(74) *Attorney, Agent, or Firm* — BCF LLP

(57) ABSTRACT

An application-specific hardware device and methods for decoding data and methods are disclosed. The data includes a plurality of encoded non-binary data symbols, the application-specific hardware device receives the plurality of encoded non-binary data symbols, each encoded non-binary data symbol being received through a corresponding channel, determines, for each encoded non-binary data symbol, a log-likelihood ratio vector, applies a successive cancellation decoding routine to the plurality of log-likelihood ratio vectors, the successive cancellation decoding routine comprising one or more groups of operations to be applied to subsets of the plurality of log-likelihood ratio vectors and generates a plurality of decoded non-binary data symbols based on a result of the successive cancellation decoding routine.

19 Claims, 16 Drawing Sheets

(56) References Cited

OTHER PUBLICATIONS

Li et al., "Research on encoding and decoding of non-binary polar codes over GF($2^{\wedge}$m)", Digital Comm. and Networks 8 (2022), pp. 359-372.
Cayci et al., "Nonbinary Polar Coding for Multilevel Modulation", OFC(2019): W3H.4.
Savin, "Non-binary polar codes for spread-spectrum modulations", 11th ISTC(2021).
Feng et al., "Simplified Successive-Cancellation List Decoding of Non-Binary Polar Codes with Rate-1 Node", IEEE Wireless Communications and Networking Conference (WCNC), 2020.
Shufeng Li et al., Research on encoding and decoding of non-binary polar codes over GF(2m), Available online Feb. 5, 2022, Digital Communications and Networks 8 (2022) 359 372.
Amin Alamdar-Yazdi et al., ASimpli ed Successive-Cancellation Decoder for Polar Codes, IEEE Communications Letters, vol. 15, No. 12, Dec. 2011, 3 pages.
Erdal Ar kan et al., Channel Polarization: A Method for Constructing Capacity-Achieving Codes for Symmetric Binary-Input Memoryless Channels, IEEE Transactions on Information Theory, vol. 55, No. 7, Jul. 2009, 23 pages.
Gabi Sarkis et al., Fast Polar Decoders: Algorithm and Implementation, IEEE Journal on Selected Areas in Communications, vol. 32, No. 5, May 2014, 12 pages.
Muhammad Hanif et al., Fast Successive-Cancellation Decoding of Polar Codes: Identi cation and Decoding of New Nodes, IEEE Communications Letters, vol. 21, No. 11, Nov. 2017, 4 pages.
Valentin Savin et al., Non-Binary Polar Codes for Spread-Spectrum Modulations, 2021 11th International Symposium on Topics in Coding, 5 pages.
Semih Cayci et al., Nonbinary Polar Coding for Multilevel Modulation, OFC 2019, 3 pages.
Baoping Feng et al., Simpli ed Successive-Cancellation List Decoding ofNon-Binary Polar Codes with Rate-1 Node, 2020 IEEE Wireless Communications and Networking Conference (WCNC), 2020, 6 pages.
Seyyed Ali Hashemi et al., Simplified Successive-Cancellation List Decoding ofPolar Codes, 2016 IEEE International Symposium on Information Theory, 5 pages.
Haotian Zheng et al., Threshold-Based Fast Successive-Cancellation Decoding of Polar Codes, IEEE Transactions on Communications, vol. 69, No. 6, Jun. 2021, 15 pages.

\* cited by examiner

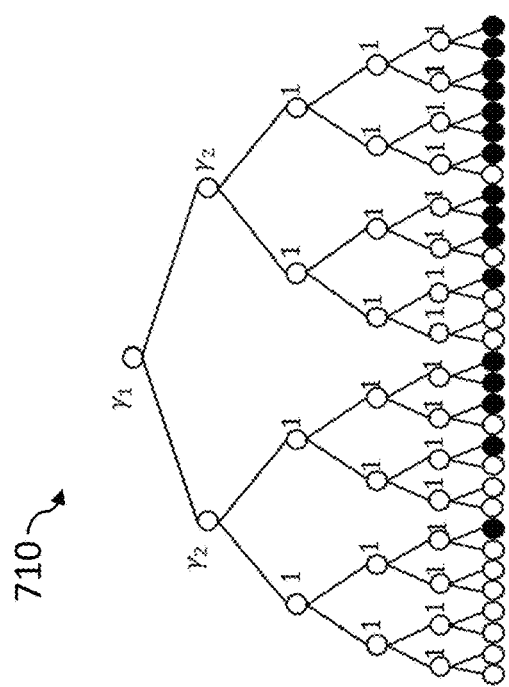
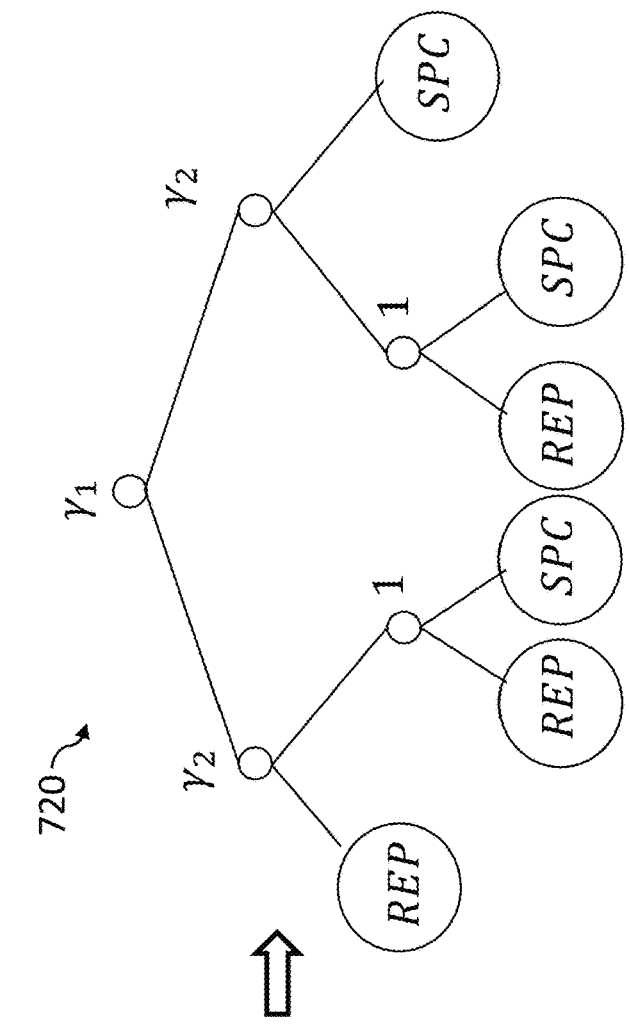
FIG. 7A
FIG. 7B

APPLICATION-SPECIFIC HARDWARE DEVICE FOR DECODING NON-BINARY POLAR CODES

TECHNICAL FIELD

The present disclosure relates to data decoding, and in particular to an application-specific hardware device for decoding non-binary polar codes.

BACKGROUND

Binary Polar codes have been proved to achieve the symmetric capacity of binary-input, discrete memoryless channels with low-complexity encoding and decoding. Non-binary polar codes (NBPCs) have been shown to be capacity achieving, like their binary counterpart. The NBPCs were investigated to improve the latency and error rate performance of binary polar codes (BPCs). Latency of NBPCs successive cancellation (SC) algorithm, due to the symbol-wise decoding is, generally, less than SC decoding of BPCs. Also, due to better performance, they can be used along with SC decoding rather than with SC lists.

Recently, the latency of BPCs has been thoroughly investigated in view of being reduced based on the concept of special nodes (or "super-nodes") in simplified-SC decoding. However, fast decoding of NBPCs is yet to be implemented, which makes the NBPCs impractical for real life application.

There is thus a desire for the fast-SC decoding of NBPCs, and more specifically, specific decoding routines for decoding special nodes of binary trees in the context of NBPCs.

SUMMARY

An aspect of the present technology is thus to provide a low-latency solution for the problem of decoding non-binary polar codes.

In a first broad aspect of the present technology, there is provided an application-specific hardware device for decoding data, the data comprising a plurality of encoded non-binary data symbols. The application-specific hardware device receives the plurality of encoded non-binary data symbols, each encoded non-binary data symbol being received through a corresponding channel, determines, for each encoded non-binary data symbol, a log-likelihood ratio vector, applies a successive cancellation decoding routine to the plurality of log-likelihood ratio vectors, the successive cancellation decoding routine comprising one or more groups of operations to be applied to subsets of the plurality of log-likelihood ratio vectors and generates a plurality of decoded non-binary data symbols based on a result of the successive cancellation decoding routine.

In some non-limiting implementations, the one or more groups of operations comprise a plurality of groups of operations and subsets of the plurality of groups of operations are successively applied to the subsets of the plurality of log-likelihood ratio vectors such than an output of a given group of operations is used, at least in part, as an input of a consecutive group of operation.

In some non-limiting implementations, an initial iteration of the successive cancellation decoding routine includes applying a first group of operations to the subsets of the plurality of log-likelihood ratio vectors. An execution of each operation of the first group of operations includes executing a first permutation operation to a first log-likelihood ratio vector, the first permutation operation being defined based on a value of a first parameter to define a first permutated log-likelihood ratio vector, determining a first output based on the first permutated log-likelihood ratio vector and a second log-likelihood ratio vector, executing a second permutation operation to the first log-likelihood ratio vector to define a second permutated log-likelihood ratio vector, the second permutation operation being defined based on a value of the first parameter and on the first output, and determining a second output based on the first permutated log-likelihood ratio vector and the second permutated log-likelihood ratio vector.

In some non-limiting implementations, a last iteration of the successive cancellation decoding routine includes applying a last group of operations to outputs of a preceding group of operations. An execution of each operation of the last group of operations includes executing a first permutation operation to a first output of the preceding group of operations in the successive cancellation decoding routine, the first permutation operation being defined based on a value of a first parameter to define a first permutated vector, determining a first main output of the successive cancellation decoding routine based on the first permutated vector and a second output of the preceding group of operations, executing a second permutation operation to the first output of the preceding group of operations to define a second permutated output, the second permutation operation being defined based on a value of the first parameter and on the first main output and determining a second main output based on the second permutated vector and the second output of the preceding group of operations.

In some non-limiting implementations, the log-likelihood ratio vectors are elements of a Galois Field comprising $2^q$ elements, q being an integer corresponding to a number of bits mapped in each of the non-binary data symbols.

In some non-limiting implementations, at least one operation of the one or more groups of operations comprises execution of an Extended Min-Sum (EMS) operation.

The application-specific hardware device of claim 1, wherein, for each given encoded non-binary data symbol, a length of a corresponding log-likelihood ratio vector is equal to a number of bits mapped in the given encoded non-binary data symbol.

In some non-limiting implementations, each of the one or more groups of operations is mapped as a node of a binary tree, each node having a corresponding node size $N_s$ and receiving a corresponding input matrix as an input, columns of the corresponding input matrix corresponding to the log-likelihood ratio vectors affected by operations of a preceding group of operations, each leaf node of the binary tree corresponding to one channel of the corresponding channels.

In some non-limiting implementations, the corresponding channels comprise a pre-determined set of information channels. The application-specific hardware device further identifies one or more pre-determined decoding routine to be executed on the binary tree.

In some non-limiting implementations, the application-specific hardware device further identifies a given node of the binary tree having its leaf nodes representable as a vector d=[a, . . . , a] wherein each of the corresponding channels are represented as "b" for information channels and "a" otherwise and executes a pre-determined decoding routine for the given node by setting an output of the given node to an all-zero vector with size $N_s$.

In some non-limiting implementations, the application-specific hardware device further identifies a given node of the binary tree having its leaf nodes representable as a vector d=[b, . . . , b] wherein each of the corresponding channels are represented as "b" for information channels and "a" otherwise and executes a pre-determined decoding routine for the given node by outputting vector of $N_s$ symbols whose corresponding log-likelihood ratio vectors in each column of the corresponding input matrix is zero.

In some non-limiting implementations, the application-specific hardware device further identifies a given node of the binary tree having its leaf nodes representable as a vector d=[a, . . . , a, b] wherein each of the corresponding channels are represented as "b" for information channels and "a" otherwise and executes a pre-determined decoding routine for the given node by summing the columns of the corresponding input matrix to obtain a sum vector and selecting a non-binary data symbol corresponding to a minimum element of the sum vector, an output of the third special node being a $N_s$ repetition of the selected non-binary data symbol.

In some non-limiting implementations, the application-specific hardware device further identifies a given node of the binary tree having its leaf nodes representable as a vector d=[a, b, . . . , b] wherein each of the corresponding channels are represented as "b" for information channels and "a" otherwise and execute a pre-determined decoding routine for the given node by generating a vector of $N_s$ non-binary data symbols whose corresponding log-likelihood ratio vectors in each column of the corresponding input matrix is zero and, in response to the vector of $N_s$ non-binary data symbols satisfying a parity check equation based on $GF(2^q)$ addition, setting the vector of $N_s$ non-binary data symbols as an output of the node, and replacing each non-binary data symbol starting with a non-binary data symbol that satisfies the parity check equation from a first non-binary data symbol otherwise.

In some non-limiting implementations, the application-specific hardware device further identifies a given node of the binary tree having its leaf nodes representable as a vector d=[a, . . . , a, b, b] wherein each of the corresponding channels are represented as "b" for information channels and "a" otherwise; and executes a pre-determined decoding routine for the given node by summing the columns having even indexes of the corresponding input matrix to obtain a first sum vector, selecting a first non-binary data symbol corresponding to a minimum element of the first sum vector, summing the columns having odd indexes of the corresponding input matrix to obtain a second sum vector, selecting a second non-binary data symbol corresponding to a minimum element of the second sum vector, an output of the node being a $N_s$ repetition of a concatenation of the first and second non-binary data symbols.

In some non-limiting implementations, the application-specific hardware device further identifies a given node of the binary tree having its leaf nodes representable as a vector d=[a, . . . , a, b, b, b] wherein each of the corresponding channels are represented as "b" for information channels and "a" otherwise; and executes a pre-determined decoding routine for the given node by determining a second matrix with $\alpha'_{k,j} = \Sigma_{k' \bmod 4 = k} \alpha_{k',j}$ where $a_{k',j}$ are the coefficient of the input matrix, generating a vector of $N_s$ non-binary data symbols whose corresponding log-likelihood ratio vectors in each column of the second matrix is zero. In response to the vector of $N_s$ non-binary data symbols satisfying a parity check equation based on $GF(2^q)$ addition, the application-specific hardware device further sets the vector of $N_s$ non-binary data symbols as an output of the node, and replaces each non-binary data symbol starting with a non-binary data symbol that satisfies the parity check from a first non-binary data symbol otherwise.

In some non-limiting implementations, the application-specific hardware device further identifies a given node of the binary tree having its leaf nodes representable as a vector d=[a, a, b, . . . , b] wherein each of the corresponding channels are represented as "b" for information channels and "a" otherwise. The application-specific hardware device further executes a pre-determined decoding routine for the given node by generating a first vector of $N_s/2$ non-binary data symbols whose corresponding log-likelihood ratio vectors in each column have an even index of the corresponding input matrix is zero and, in response to the first vector of not satisfying a parity check equation based on $GF(2^q)$ addition, replacing each non-binary data symbol starting with a non-binary data symbol that satisfies the parity check from a first non-binary data symbol, generating a second vector of $N_s/2$ non-binary data symbols whose corresponding log-likelihood ratio vectors in each column having an odd index of the corresponding input matrix is zero. In response to the second vector of not satisfying a parity check equation based on $GF(2^q)$ addition, the application-specific hardware device further replaces each non-binary data symbol starting with a non-binary data symbol that satisfies the parity check, an output of the node being an alternated concatenation of the first and second vectors.

In some non-limiting implementations, the application-specific hardware device further identifies a given node of the binary tree having its leaf nodes representable as a vector d=[a, a, a, b, . . . , b] wherein each of the corresponding channels are represented as "b" for information channels and "a" otherwise and executes a pre-determined decoding routine for the given node by summing the columns of the corresponding input matrix to obtain a sum vector, selecting a first non-binary data symbol corresponding to a minimum element of the sum vector, generating a vector of $N_s-1$ non-binary data symbols whose corresponding log-likelihood ratio vectors in each column of the corresponding input matrix is zero and, in response to the vector not satisfying a parity check equation based on $GF(2^q)$ addition, replacing each non-binary data symbol starting with a non-binary data symbol that satisfies the parity check, an output of the node being a concatenation of the vector and the first non-binary data symbol.

In some non-limiting implementations, the application-specific hardware device further identifies a given node of the binary tree having its leaf nodes representable as a vector d=[a, . . . , a, a, a, b, a, b, b, b] wherein each of the corresponding channels are represented as "b" for information channels and "a" otherwise and executes a pre-determined decoding routine for the given node by summing columns of the input matrix whose indexes differ by a multiple of 8 to define eight LLR output vectors, an output of the node being a concatenation of repetitions of the eight LLR output vectors.

In some non-limiting implementations, the application-specific hardware device further identifies a given node of the binary tree having its leaf nodes representable as a vector d=[a, . . . , a, b, . . . , b] comprising $n_r$ "a", wherein the channels are represented as "b" for information channels and "a" otherwise and executes a pre-determined decoding routine for the given node by determining a set of $n_r$ equations, solving the $n_r$ equations in parallel by, for each equation, generating a vector of $N_s/n_r$ non-binary data symbols whose corresponding log-likelihood ratio vectors in each column of the corresponding input matrix is zero and, in response to the vector of $N_s/n_r$ non-binary data symbols satisfying a parity check equation based on $GF(2^q)$ addition, setting the vector of $N_s/n_r$ non-binary data symbols as an output of the node, and replacing each non-binary data symbol starting with a non-binary data symbol that satisfies the parity check equation from a first non-binary data symbol otherwise.

In some non-limiting implementations, each node is associated with a calculation parameter used for performing operations of the corresponding group of operations.

In some non-limiting implementations, the application-specific hardware device further identifies that the calculation parameters of nodes of a same level of the binary tree are equal.

In some non-limiting implementations, the application-specific hardware device further identifies that the binary tree comprises at least three levels, calculation parameters of the leaf nodes being equal to 1.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

Embodiments of the present disclosure will be described by way of example only with reference to the accompanying drawings, in which:

FIGS. 7A and 7B include a representation of a binary tree in accordance with some non-limiting implementations of the present technology and a representation of a trimmed version of said binary tree with identification of special nodes thereof in accordance with some non-limiting implementations of the present technology;

DETAILED DESCRIPTION

Figure 1:
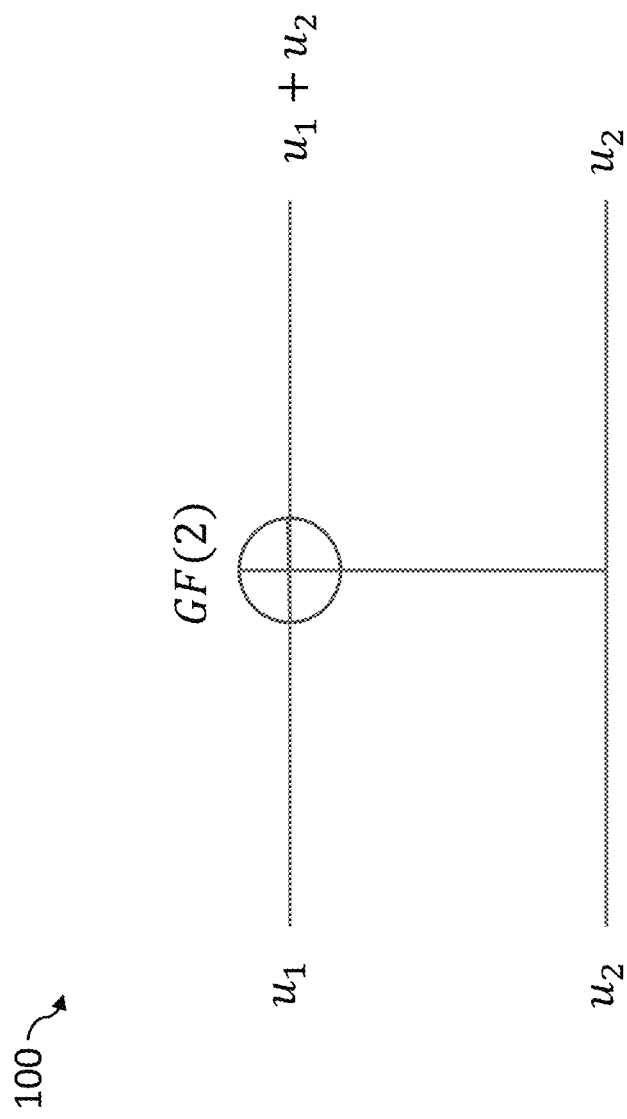
FIG. 1 is a graphical representation of a binary polarization kernel in a Galois Field of cardinal 2.

Polar codes are a class of capacity-achieving linear block codes with explicit code constructions and low complexity encoding and decoding algorithms. They can be constructed based on the concept of channel polarization in which a recursive application of a polarization kernel results in synthesized channels. FIG. 1 is graphical representation of a binary polarization kernel 100. The circle "+" symbol represents modulo 2 addition.

For a binary code (i.e. from left to right on FIG. 1), an input vector with bits $[u_1, u_2]$ is multiplied by the kernel 100, to generate an output vector with bits $[u_1+u_2, u_2]$. The bits $u_1, u_2$ are elements of a Galois field of cardinal 2. Use of polarization kernels in the context of binary polar codes is described in greater details in "Channel polarization: A method for constructing capacity achieving codes for symmetric binary-input memoryless channels", by E. Arikan, *IEEE Trans. Inf. Theory*, vol. 55, pp. 3051-3073, published in July 2009, the entirety of which is incorporated by reference.

Figure 2:
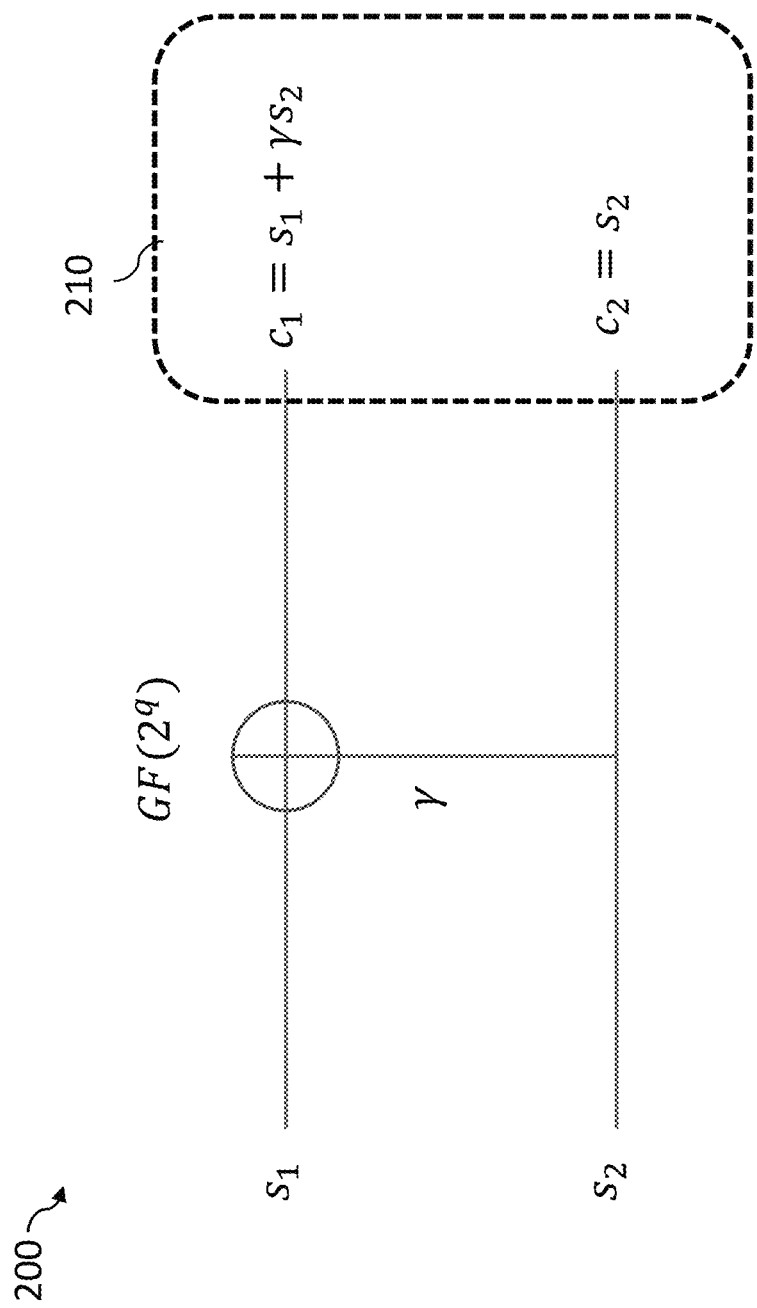
FIG. 2 is a graphical representation of a binary polarization kernel in a Galois Field of cardinal $2^q$ where q is an integer.

For non-binary codes and with respect to FIG. 2, the input vector of a non-binary polarization kernel 200 includes non-binary symbols 210. Each non-binary symbol 210 maps q binary bits. In this example, an input vector of the kernel 200 includes non-binary symbols $[s_1, s_2]$ and an output vector generated by the kernel 200 includes non-binary symbols $[c_1, c_2]=[s_1+\gamma s_2, s_2]$, where $\gamma$ is a pre-defined operation parameter. The non-binary symbols $s_1, s_2$ and the pre-defined operation parameter $\gamma$ are elements of a Galois field of cardinal $2^q$, referred to as $GF(2^q)$, where q is an integer. The circle "+" symbol in the kernel 200 represents an addition in $GF(2^q)$.

It is noted that the multiplication of $s_2$ with $\gamma$ is equivalent to circular permutation of field elements and addition in $GF(2^q)$ is a bit-wise XOR logical operation of q-ary binary representation of $s_1$ and $\gamma s_2$. Recursive application of the kernel 200 in FIG. 2 results in the construction of a non-binary polar code.

In use, non-binary symbols are received from an encoding module at a decoding module of a receiver to be decoded, each non-binary symbols being received through a communication channel of the receiving module. An implementation of a decoding module is described in greater details herein after. A pre-determined set of communication channels are defined as reliable channels that are used to carry non-binary symbols while inputs of the rest of the communication channels, referred to as "frozen" channels, are set to a fixed value which is known at the decoding module.

Figure 3:
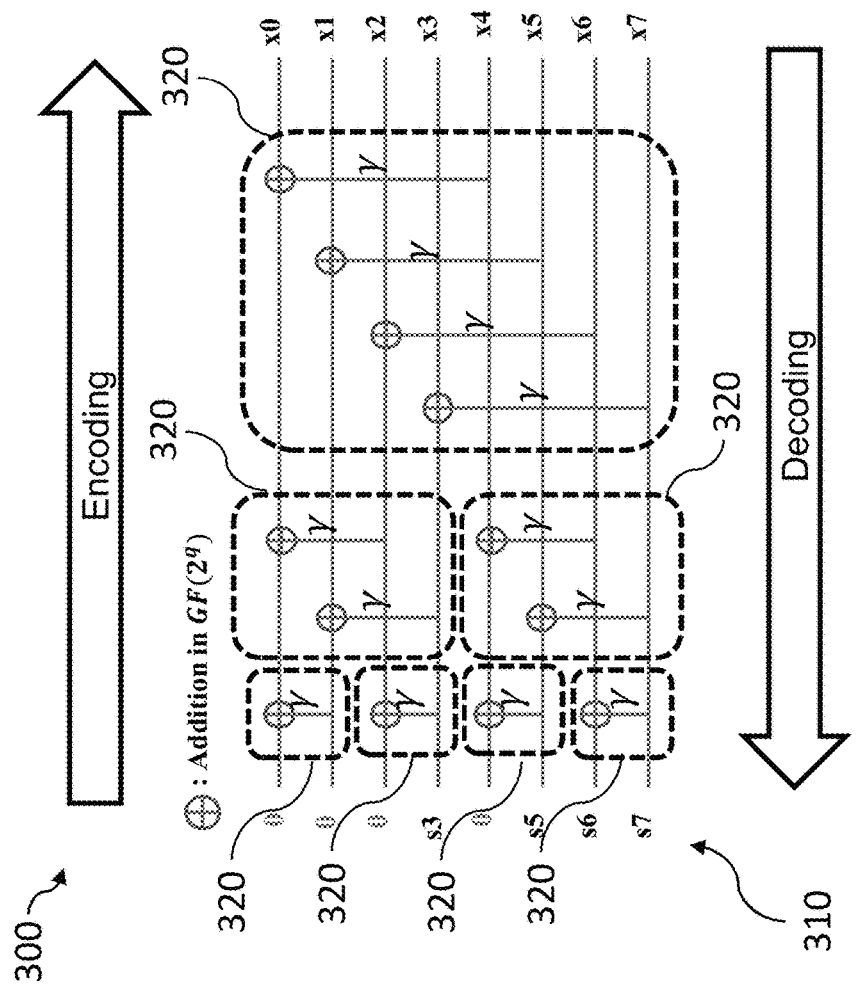
FIG. 3 is a schematic representation of a polar encoding/decoding pipeline 300

With reference to FIG. 3, there is shown a diagram of an illustrative use of a polar encoding/decoding pipeline 300. From a left-end side of FIG. 3 to a right-end side thereof, the polar encoding/decoding pipeline 300 acts as a polar non-binary encoder. From the right-end side of FIG. 3 to the left-end side thereof, the polar encoding/decoding pipeline 300 acts as a polar non-binary decoder.

An input vector 310 includes "information" symbols, which are non-binary symbols $s_3$, $s_5$ $s_6$ and $s_7$, corresponding to four reliable channels, and four "frozen" symbols, which are non-binary symbols set to 0 in this example and corresponding to the frozen channels. An input vector including K=4 information non-binary symbols and N−K=4 frozen non-binary symbols. Each of these information non-binary symbols can be represented by q bits. It can also be said that each information non-binary symbol maps the information of q bits. For example, in a scenario where q=2, an input of the encoder may be 00010111, which can be mapped into four information non-binary symbols 0, 1, 1, 3. These four symbols may then be encoded by non-binary encoder 300.

The output of the non-binary encoder 300 (i.e., x0, . . . , x7) are encoded non-binary symbols. The encoded non-binary symbols may be turned into a binary sequence with length 8q and referred to as a polar code.

Frozen non-binary symbols are set to 0 in the illustrative example of FIG. 3. Frozen non-binary symbols may be set to another pre-determined value that is known at the decoding module and the encoding module.

The operation parameter γ may be randomly chosen from elements of $GF(2^q)$ or be equal to a primitive element of $GF(2^q)$. Using random or fixed operation parameter γ results in polarization but may not be efficient in terms of latency of decoding. In one aspect of the present technology, a low-latency decoding module that is suitable for fast SC decoding as well as for systematic-encoding is provided.

Unlike binary polar codes in which each bit has only 2 possibilities, there are $2^q$ possibilities for each non-binary symbol. Therefore, a single log-likelihood ratio (LLR) cannot represent all the possibilities of a non-binary symbol. Therefore, a vector of LLRs of length q is defined for each non-binary symbol.

In some implementations, a LLR vector of $c_1$ may be noted:

$$L^{c_1}=[l_0^{c_1}, \ldots, l_{2^q-1}^{c_1}]^t$$

where $$l_k^{c_1} = \log\left(\frac{p_{c_1=k'}}{p_{c_1=k}}\right)$$

with $k \in [0, \ldots, 2^q-1]$ and $p_{c_1=k'}$ is a probability of maximum likelihood field elements related to positions $c_1$.

Similarly, a LLR vector of $c_2$ may be noted:

$$L^{c_2}=[l_0^{c_2}, \ldots, l_{2^q-1}^{c_1}]^t$$

wherein $$l_k^{c_2} = \log\left(\frac{p_{c_2=k''}}{p_{c_2=k}}\right)$$

with $k \in [0, \ldots, 2^q-1]$ and $p_{c_2=k''}$ is a probability of maximum where likelihood field elements related to positions $c_2$.

Figure 4:
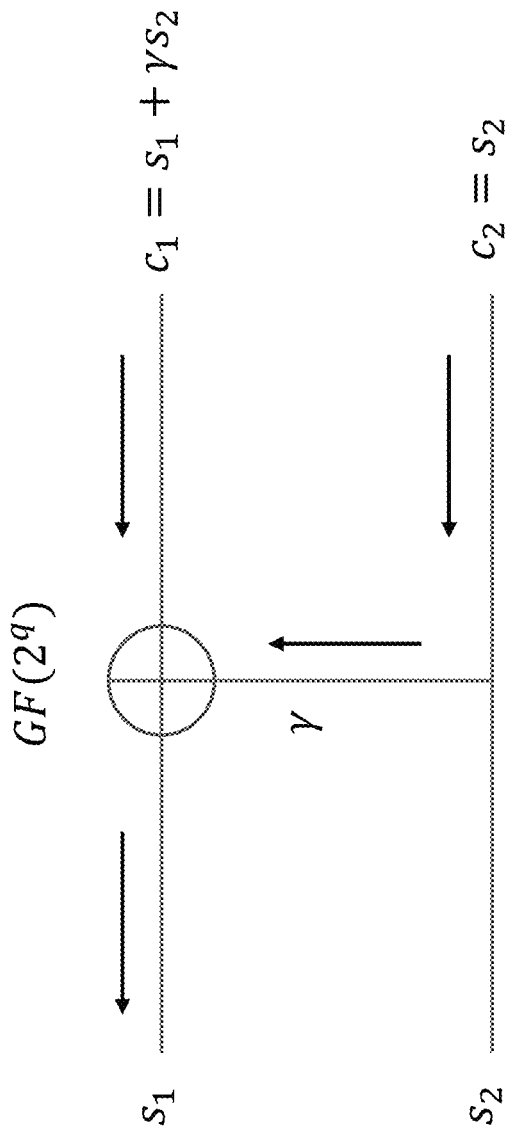
FIG. 4 is a graphical representation of a binary polarization kernel for decoding a first non-binary data symbol in a Galois Field of cardinal $2^q$.
Figure 5:
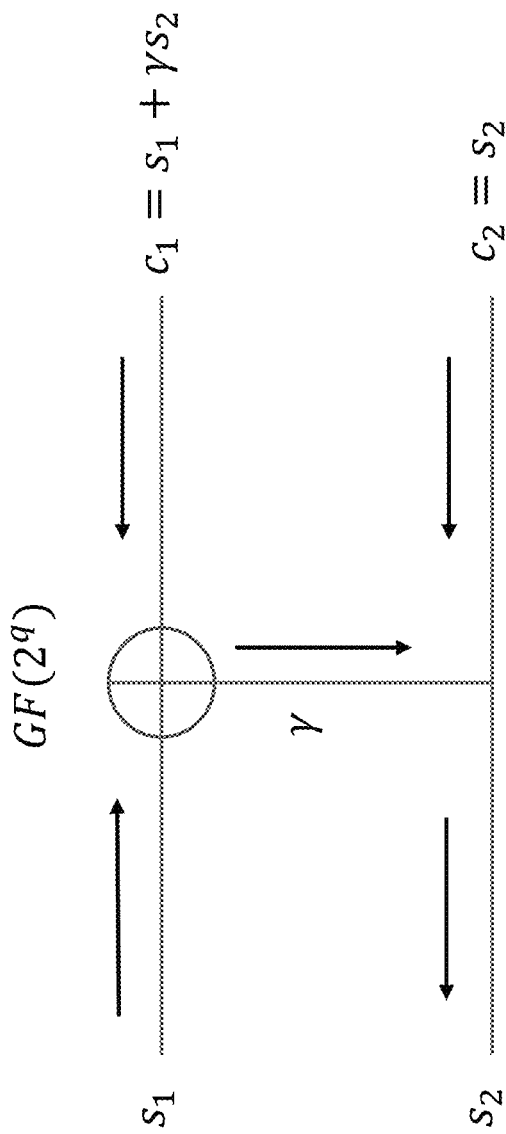
FIG. 5 is a graphical representation of a binary polarization kernel for decoding a second non-binary data symbol in a Galois Field of cardinal $2^q$ using the first non-binary data symbol.

An example of SC decoding of non-binary polar code is given with respect to FIGS. 4 and 5 for GF(4). Based on a SC schedule, first the messages toward $s_1$ is calculated and then the message toward $s_2$ is calculated based on the estimate of $s_1$.

First, an estimate of $s_1$ is determined. With reference to FIG. 4, the LLR-vectors of $c_1$ and $c_2$ are used. More specifically, a permutation based on the operation parameter γ is applied to $L^{c_2}$:

$$T^{c_2}=\Pi_\gamma L^{c_2}=[t_0^{c_2}, t_1^{c_2}, t_2^{c_2}, t_3^{c_2}]$$

where $\Pi_\gamma$ is a permutation matrix that permutes the elements of LLR vector $L^{c_2}$ based on the value of γ.

The LLR vector of $s_1$ is thus defined as $L^{s_1}=[l_0^{s_2}, l_1^{s_1}, l_2^{s_2}, l_3^{s_1}]^t$ where $$l_0^{s_1} \approx \min(l_0^{c_1}+t_0^{c_2}, l_1^{c_1}+t_1^{c_2}, l_2^{c_1}+t_2^{c_2}, l_3^{c_1}+t_3^{c_2});$$

$$l_1^{s_1} \approx \min(l_0^{c_1}+t_1^{c_2}, l_1^{c_1}+t_0^{c_2}, l_2^{c_1}+t_3^{c_2}, l_3^{c_1}+t_2^{c_2});$$

$$l_2^{s_1} \approx \min(l_0^{c_1}+t_2^{c_2}, l_2^{c_1}+t_0^{c_2}, l_1^{c_1}+t_3^{c_2}, l_3^{c_1}+t_1^{c_2}); \text{ and}$$

$$l_3^{s_1} \approx \min(l_0^{c_1}+t_3^{c_2}, l_3^{c_1}+t_0^{c_2}, l_1^{c_1}+t_2^{c_2}, l_2^{c_1}+t_1^{c_2});$$

An estimate $\hat{s}_1$ of $s_1$ may further be determined based on the LLR vector of $s_1$ using conventional decision techniques.

Subsequently to having determined the estimate of $\hat{s}_1$, an estimate of $s_2$ may be determined. With reference to FIG. 5, another permutation based on the operation parameter γ and the estimate $\hat{s}_1$ is applied to $L^{c_1}$:

$$R^{c_2}=\Pi_\gamma^{-1} \Pi_{\hat{s}_1} L^{c_1}=[r_0^{c_1}, r_1^{c_1}, r_2^{c_1}, r_3^{c_1}]$$

where $\Pi_\gamma^{-1}$ is the inverse permutation of $\Pi_\gamma$ and $\Pi_{\hat{s}_1}$ is a permutation matrix that permutes the elements of LLR vector according to the value of $\Pi_{\hat{s}_1}$.

The LLR vector of $s_1$ is thus defined as $L^{s_2}=[l_0^{s_2}, l_1^{s_2}, l_2^{s_2}, l_3^{s_2}]^t$ where:

$$L^{s_2}=R^{c_2}+L^{c_2}-\min(l_0^{s_2}, l_1^{s_2}, l_2^{s_2}, l_3^{s_2})1_4, \text{ where } 1_4=[1,1,1,1]^t.$$

The example of decoding described in FIGS. 4 and 5 relates to GF(4). Decoding for $GF(2^q)$ for q>2 may be recursively performed based on the same process.

Figure 6:
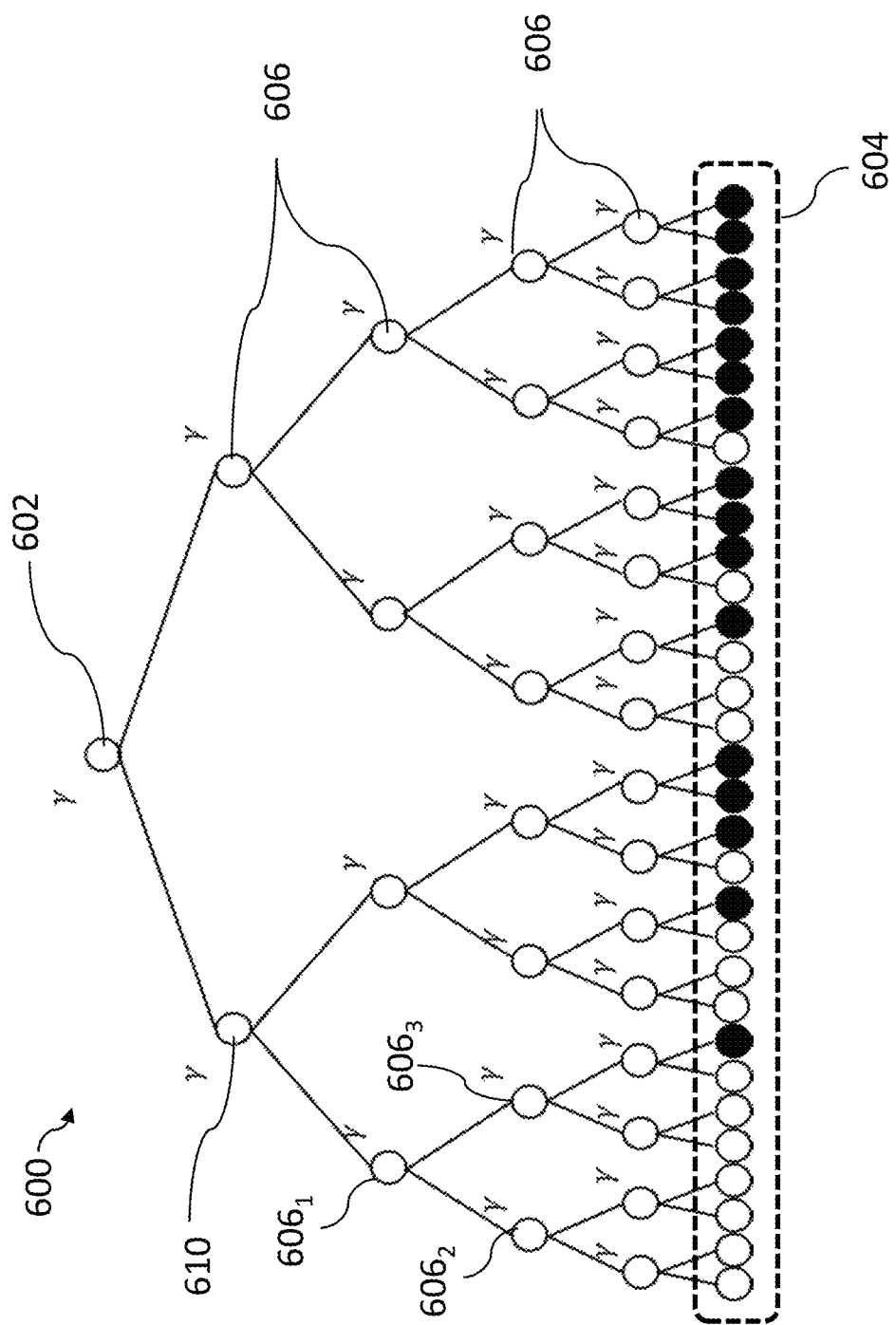
FIG. 6 is a graphical representation of a binary tree.

Referring back to FIG. 3, operations of the pipeline 300 may be grouped into groups of operations 320 and represented by a binary tree 600, as depicted on FIG. 6. A group of operations 320 is mapped as a node 610 of the binary tree 600. The binary tree 600 includes a root node 602, leaf nodes 604 and intermediate nodes 606. By definition, each of the intermediate nodes 606 and the root node 602 has a right child node and a left child node. For example, on FIG. 6, the intermediate node $606_1$ has a left child node $606_2$ and a right child node $606_3$. The leaf nodes may be referred to as "synthesized channels" or "polarized channels", both in the encoding and decoding side of the polar encoding/decoding pipeline 300. It can be said that each leaf node 604 corresponds to one communication channel of the decoding module.

Each node has a node length $N_s$ corresponding to a number of operations of the corresponding group of operations. In some implementations, for a node $N_o$ of node length $N_s$ of the binary tree 600, a matrix $\alpha_o$ of LLR-derived values is received from the parent node.

$$a_o = \begin{bmatrix} \alpha_{0,0}^0 & \cdots & \alpha_{N_s,0}^0 \\ \vdots & \cdots & \vdots \\ \alpha_{0,2^q-1}^0 & \cdots & \alpha_{N_s,2^q-1}^0 \end{bmatrix}$$

The output of the given node is a vector of size $N_s$ that contains $N_s$ corresponding estimated non-binary symbols. It should be noted that $N_s$ is a power of 2.

In use, a given node outputs a corresponding symbol vector β comprising a set of estimated non-binary symbols, as will be expressed hereinbelow.

Although six levels are represented on the binary tree 600, it should be understood that a binary tree to decode a non-binary code of length N, the number of tree levels is log 2(N). Here the code length is N=32, so five levels are depicted for the binary tree 600.

In this example, the binary tree 600 may be used to decode an input vector $[u_0, u_1, \ldots, u_5]$ of six non-binary symbols into a output vector $[\hat{u}_0, \hat{u}_1, \ldots, \hat{u}_5]$ of corresponding estimated non-binary symbols, or simply "estimates". In use, the estimates $\hat{u}_0$ is used to determine the estimates $\hat{u}_1$, the estimates $\hat{u}_1$ and $\hat{u}_0$ are used to determine the estimates $\hat{u}_2$, and so on. Such decoding process may be referred to as a Successive-Cancellation (SC) decoding and is performed by traversing the entire binary tree 600. A decoding process for decoding a binary tree including binary data symbols may be implemented as described in "A simplified successive cancellation decoder for polar codes" by A. Alamdar-Yazdi and F. R. Kschischang, IEEE Commun. Lett., vol. 15, no. 12, pp. 1378-1380, published in December 2011, the entirety of which is incorporated by reference.

As such, because one estimate is determined before a next estimate can be determined, decoding a non-binary polar code may be a high-latency task. Developers of the present technology have devised definitions of special nodes in non-binary trees and algorithms to decode said special nodes. Implementation of the special nodes in a hardware-based decoding module may decrease a number of components needed to perform functions of the decoding module, and thus decrease a computation time of the decoding operation.

FIG. 6 is a representation of a binary tree 600 where each node is associated with the same pre-defined operation parameter γ. In an implementation of the present technology, the calculation parameters of at least the leaf nodes 604 are set equal to 1. For example, FIG. 7A shows a representation of a binary tree 710 in accordance with some implementations of the present technology. In this illustrative implementation, the root node of the binary tree 710 has a first pre-defined operation parameter $\gamma_1$, the nodes of the first level of the binary tree 710 have a same second pre-defined operation parameter $\gamma_2$, and other nodes of other levels have their correspond pre-defined operation parameter equal to 1. This may simplify identification of special nodes, simplify a decoding of the special nodes and enable removal of the permutation operation i.e., $\Pi_\gamma$ and $\Pi_\gamma^{-1}$ from the SC decoding in lower parts of the binary tree, thereby reducing a number of operation and reducing a computation time.

As such, in an implementation, the calculation parameters of nodes of a same level of the binary tree 710 are equal. In this example, for a binary tree including at least three levels, calculation parameters of the leaf nodes 604 are equal to 1. However, even without setting these pre-defined operation parameters of the leaf nodes 1, special nodes for a non-binary code can still be defined and decoded.

In the context of the present disclosure, for a given node $N_o$ of node length $N_s$, leaf nodes $N_{o,0}, N_{o,1}, \ldots, N_{o,m}$ of the node $N_o$ are mapped into a node vector $d_0=[N_{o,0}, N_{o,1}, \ldots, N_{o,m}]$. It should be noted that names given to the special nodes are similar to the names of special nodes of binary trees in the context of binary polar codes, as described in "Fast successive-cancellation decoding of polar codes: Identification and decoding of new nodes", by M. Hanif and M. Ardakani, IEEE Commun. Lett., vol. 21, no. 11, pp. 2360-2363, published in November 2017, the entirety of which is incorporated by reference. However, decoding of the special nodes in the context of the present disclosure is different from decoding special nodes of binary trees in the context of binary polar codes, as described herein below.

Referring to FIGS. 7A and 7B, the binary tree 710 may be simplified, or "trimmed", by identifying special nodes included therein, each special node being decodable using a corresponding routine or algorithm, thereby generating a new trimmed binary tree 720. In an implementation, if a first special has a parent node that is a second special node, the first special node is ignored.

Rate0 Nodes

For a node vector $d_0=[0, \ldots, 0]$ mapping the leaf nodes of the node $N_o$, the node $N_o$ is named "Rate0" and an output of the node $N_o$ is an all-zero vector of size $N_s$. For example, with a node size $N_S=8$, the output symbol vector of the node $N_o$ is β=[0, 0, 0, 0, 0, 0, 0, 0].

Rate1 Nodes

For a node vector $d_0=[1, \ldots, 1]$ mapping the leaf nodes of the node $N_o$, the node $N_o$ is named "Rate1" and an output of the node $N_o$ is a vector of $N_s$ symbols whose corresponding LLR-derived value in each column of $\alpha_o$ is zero. It can be said that the algorithm to decode a "Rate1" node is a hard decision in extended min sum (EMS) algorithm.

For example, with a node size $N_S=4$ and the input matrix $\alpha_0$ of $$\alpha_0 = \begin{bmatrix} 0 & 11 & 15 & 27 \\ 4 & 1 & 15 & 24 \\ 18 & 0 & 0 & 7 \\ 25 & 10 & 9 & 0 \end{bmatrix},$$

the output of this node is a vector of $N_s$ symbols whose corresponding LLR in each column of $\alpha_o$ is zero. In this implementation, an EMS algorithm is used for hard-decisioning. As a result, the output symbol vector β has a size 4: β=[0, 2, 2, 3].

For a node vector $d_0=[0, \ldots, 0, 1]$ mapping the leaf nodes of the node $N_o$, the node $N_o$ is named "Repetition", or simply "REP". To determine an output of the node, the columns of $\alpha_o$ are added to each other to obtain a single vector of LLR-derived values. Then the symbol corresponding to minimum LLR-derived value is chosen as the hard decision. The output of the node is the $N_s$ repetition of the estimated symbol.

For example, with size $N_S=4$ and the matrix $\alpha_o$ at the top of the node is the 4×4 matrix given as $$\alpha_o = \begin{matrix} 0 \\ 1 \\ 2 \\ 3 \end{matrix} \begin{bmatrix} 0 & 11 & 15 & 27 \\ 4 & 1 & 15 & 24 \\ 18 & 0 & 0 & 7 \\ 25 & 10 & 9 & 0 \end{bmatrix},$$

the columns of $\alpha_o$ are added to each other to obtain a single vector of LLRs to decode the REP node. the symbol corresponding to minimum LLR is chosen as the hard decision. In an implementation, the output is the $N_s$ repetition of the estimated symbol. Adding the symbols of the columns of $\alpha_o$ on a per row basis results in the vector $\alpha^+$ as $$\alpha^+ = \begin{bmatrix} 53 \\ 44 \\ 25 \\ 44 \end{bmatrix}.$$

The minimum symbol of $\alpha^+$ is 25 which corresponds to the symbol on row 2 (rows are indexed from 0 to 3), hence, the output of this node will be 4 repetitions of symbol 2 as $\beta=[2, 2, 2, 2]$.

SPC Nodes

For a node vector $d_0=[0, 1, \ldots, 1, 1]$ mapping the leaf nodes of the node $N_o$, the node $N_o$ is named "Single Parity Check", or simply "SPC". To determine an output of the node, a hard decision is made on $\alpha_o$. More specifically, if the resulting estimate satisfies the parity check equation based on $GF(2^q)$ addition, then the output of the node is the estimated non-binary symbol. Otherwise, starting from the first symbol, each of the codeword symbols is replaced with a symbol that satisfies the parity check and its corresponding LLR is recorded. Ultimately, the codeword symbol whose LLR after replacement is the minimum will be chosen to satisfy the parity.

For example, with size $N_S=4$ and the matrix $\alpha$ at the top of the node is the 4×4 matrix given as $$\alpha_o = \begin{matrix} 0 \\ 1 \\ 2 \\ 3 \end{matrix} \begin{bmatrix} 0 & 11 & 15 & 27 \\ 4 & 1 & 15 & 24 \\ 18 & 0 & 0 & 7 \\ 25 & 10 & 9 & 0 \end{bmatrix},$$

The first stage of decoding a SPC node is similar to a Rate1 node, namely a hard-decision on $\alpha_q$. Said hard-decision results in obtaining, in this example $\hat{\beta}=[0, 2, 2, 3]$, instead of $\beta$ for reasons expressed below.

In the second stage, the summation of the symbols of $\beta$ in GF(4) is compared with zero to check whether $\hat{\beta}$ satisfies the parity check equation in GF(4) (i.e. the sum is equal to zero). In this example, the sum is:

0+2+2+3=(0,0)+(1,0)+(1,0)+(1,1)=(1,1)=3

The above summation was obtained according to bitwise XOR of binary representation of each symbol. As can be seen, the result of summation is 3 and not 0 implying that the parity equation has not been satisfied.

If parity was satisfied, the output $\beta$ would be equal to $\hat{\beta}$. Since the parity is not satisfied, each of the symbols is replaced by another symbol that can satisfy the parity and its corresponding LLR is recorded. This will result in 4 different vectors that can potentially be the output of the SPC node:

$\widehat{\beta_0}=[3,2,2,3] \rightarrow$ LLRs=[25,0,0,0]

$\widehat{\beta_1}=[0,1,2,3] \rightarrow$ LLRs=[0,1,0,0]

$\widehat{\beta_2}=[0,2,1,3] \rightarrow$ LLRs=[0,0,15,0]

$\widehat{\beta_3}=[0,2,2,0] \rightarrow$ LLRs=[0,0,0,27]

The LLRs of the modified symbols above are the penalty of changing those symbols. To have a small penalty, we choose $\widehat{\beta_1}$ as the output, i.e., $\beta = \widehat{\beta_1}$.

T1 Nodes

For a node vector $d_0=[0, 0, \ldots, 0, 1, 1]$ mapping the leaf nodes of the node $N_o$, the node $N_o$ is named "Type 1", or simply "T1". To determine an output of the node, the decoding algorithm of a REP node is applied separately to columns of $\alpha_o$ having even indices, and to columns of $\alpha_o$ having odd indices. Indeed, T1 node is equivalent to having two REP nodes between the symbols located at even and odd positions, separately. In the context of the present disclosure, if the symbols that are supposed to be the output of a special node are indexed from 0 to $N_S-1$, the symbols at even positions are those located at 0, 2, 4, ..., $N_S-2$ and those at odd positions are located at 1, 3, ..., $N_S-1$.

For example, with size $N_S=8$ and the matrix $\alpha_o$ at the top of the node is the 4×8 matrix given as $$\alpha_o = \begin{matrix} 0 \\ 1 \\ 2 \\ 3 \end{matrix} \begin{bmatrix} 0 & 11 & 15 & 27 & 20 & 13 & 0 & 27 \\ 4 & 1 & 15 & 24 & 15 & 8 & 15 & 0 \\ 18 & 0 & 0 & 7 & 34 & 0 & 0 & 7 \\ 25 & 10 & 9 & 0 & 0 & 20 & 9 & 18 \end{bmatrix},$$

this node is equivalent to having two REP nodes between the symbols located at even and odd positions, separately. Therefore, the same decoding of REP nodes can be applied to even and odd indices, respectively. So for even and odd indexes, $\alpha_o$ may be decomposed into 2 submatrix as $$\alpha_e = \begin{matrix} 0 \\ 1 \\ 2 \\ 3 \end{matrix} \begin{bmatrix} 0 & 15 & 20 & 0 \\ 4 & 15 & 15 & 15 \\ 18 & 0 & 34 & 0 \\ 25 & 9 & 0 & 9 \end{bmatrix}, \alpha_{od} = \begin{matrix} 0 \\ 1 \\ 2 \\ 3 \end{matrix} \begin{bmatrix} 11 & 27 & 13 & 27 \\ 1 & 24 & 8 & 0 \\ 0 & 7 & 0 & 7 \\ 10 & 0 & 20 & 18 \end{bmatrix}$$

Similar to REP node, the symbols of the columns of $\alpha_{od}$ and $\alpha_e$ are added on a per row basis which gives:

$$\alpha_e^+ = \begin{bmatrix} 35 \\ 49 \\ 52 \\ 43 \end{bmatrix}, \alpha_{od}^+ = \begin{bmatrix} 78 \\ 33 \\ 14 \\ 48 \end{bmatrix}$$

The minimum symbols in $\alpha_e^+$ and $\alpha_{od}^+$ are related to symbols 0 and 2 respectively. So $\beta$ can be written as $\beta=[0, 2, 0, 2, 0, 2, 0, 2]$. The output of the T1 node is a $N_s$ repetition of a concatenation of the first and second non-binary data symbols (here 0 and 2)

T2 Nodes

For a node vector $d_0=[0, 0, \ldots, 0, 1, 1, 1]$ mapping the leaf nodes of the node $N_o$, the node $N_o$ is named "Type 2", or simply "T2". This node can be seen as a number of Rate0 nodes on the left and a SPC node of size 4 on the right. Assuming the symbol vector at the output of SPC node is $\{\beta'_0, \beta'_1, \beta'_2, \beta'_3\}$, then the symbol vector $\beta$ at the output of a T2 has node a pattern similar to $\beta=\{\beta'_0, \ldots, \beta'_3, \beta'_0, \ldots, \beta'_3, \beta'_0, \ldots, \beta'_3, \beta'_0, \ldots\}$.

Consequently, a decoding algorithm for the T2 node adds the LLR-derived values of the non-binary symbols related to 4 partition of $\beta$. These LLR-derived values are then input to NB decoder for SPC nodes to yield estimates of $\{\widehat{\beta_0}, \widehat{\beta_1}, \widehat{\beta_2}, \widehat{\beta_3}\}$ in SC algorithm:

$$\alpha'_{k,j} = \sum_{k' \bmod 4 = k} \alpha_{k',j}$$

For example, with size $N_S=8$ and the matrix $\alpha_o$ at the top of the node being a 4×8 matrix given as:

$$\alpha_o = \begin{matrix} 0 \\ 1 \\ 2 \\ 3 \end{matrix} \begin{bmatrix} 0 & 11 & 15 & 27 & 20 & 13 & 0 & 27 \\ 4 & 1 & 15 & 24 & 15 & 8 & 15 & 0 \\ 18 & 0 & 0 & 7 & 34 & 0 & 0 & 7 \\ 25 & 10 & 9 & 0 & 0 & 20 & 9 & 18 \end{bmatrix},$$

this node consists of a Rate0 node as the left descendant and a SPC node of size 4 as the rightmost descendant. Assuming the symbol vector at the output of SPC node is $\{\beta'_0, \beta'_1, \beta'_2, \beta'_3\}$, then the symbol vector $\beta$ at the output of this T2 node has a pattern similar to $\beta = \{\beta'_0, \ldots, \beta'_3, \beta'_0, \ldots, \beta'_3\}$. Consequently, the optimal maximum likelihood decoder adds the LLRs of the bits related to 4 partition of $\beta$. These LLRs are then input to non-binary decoder for SPC nodes to yield estimates of $\{\widehat{\beta_0}, \widehat{\beta_1}, \widehat{\beta_2}, \widehat{\beta_3}\}$ in SC algorithm. So, the LLRs for SPC decoding can be calculated as:

$$\alpha'_{k,j} = \sum_{k' \bmod 4 = k} \alpha_{0k',j}$$

with $k'=0, \ldots, N_s$, $K=0, \ldots, 3$, $j=0, \ldots, 2^q-1$.
In matrix form, this gives $$\alpha' = \begin{matrix} 0 \\ 1 \\ 2 \\ 3 \end{matrix} \begin{bmatrix} 0+20 & 11+13 & 15+0 & 27+27 \\ 4+15 & 1+8 & 15+15 & 24+0 \\ 18+34 & 0+0 & 0+0 & 7+7 \\ 25+0 & 10+20 & 9+9 & 0+18 \end{bmatrix}$$

The decoding routine for an SPC node of size 4 with $\alpha'$ as its input may now be used. Assuming the output of SPC decoder is the vector $\{\beta'_0, \beta'_1, \beta'_2, \beta'_3\}$, then, the output of this T2 node is equal to $\beta = \{\beta'_0, \beta'_1, \beta'_2, \beta'_3, \beta'_0, \beta'_1, \beta'_2, \beta'_3\}$.

T3 Nodes

For a node vector $d_0=[0, 0, 1, \ldots, 1]$ mapping the leaf nodes of the node $N_o$, the node $N_o$ is named "Type 3", or simply "T3". This node is equivalent to having two SPC nodes between the symbols located at even and odd positions, separately. Therefore, a decoding algorithm of a SPC node is applied separately to columns of $\alpha_o$ having even indices, and to columns of $\alpha_o$ having odd indices.

For example, with size $N_S=8$ and the matrix $\alpha$ at the top of the node being a 4×8 matrix given as:

$$\alpha_o = \begin{matrix} 0 \\ 1 \\ 2 \\ 3 \end{matrix} \begin{bmatrix} 0 & 11 & 15 & 27 & 20 & 13 & 0 & 27 \\ 4 & 1 & 15 & 24 & 15 & 8 & 15 & 0 \\ 18 & 0 & 0 & 7 & 34 & 0 & 0 & 7 \\ 25 & 10 & 9 & 0 & 0 & 20 & 9 & 18 \end{bmatrix},$$

this node is equivalent to having two SPC node between the symbols located at even and odd positions, separately. Therefore, the same decoding of SPC node may be applied to even and odd indices, respectively. In this example, $\alpha_o$ may be decomposed, for even and odd indices, into two submatrices as $$\alpha_e = \begin{matrix} 0 \\ 1 \\ 2 \\ 3 \end{matrix} \begin{bmatrix} 0 & 15 & 20 & 0 \\ 4 & 15 & 15 & 15 \\ 18 & 0 & 34 & 0 \\ 25 & 9 & 0 & 9 \end{bmatrix}, \alpha_{od} = \begin{matrix} 0 \\ 1 \\ 2 \\ 3 \end{matrix} \begin{bmatrix} 11 & 27 & 13 & 27 \\ 1 & 24 & 8 & 0 \\ 0 & 7 & 0 & 7 \\ 10 & 0 & 20 & 18 \end{bmatrix}$$

The decoding routine for SPC nodes may be separately applied to $\alpha_e$ and $\alpha_{od}$. Assuming that the output of SPC-even and SPC-odd decoders may be written as $\beta_e=\{\beta_{e,0}, \ldots, \beta_{e,3}\}$, $\beta_o=\{B_{o,0}, \ldots, \beta_{o,3}\}$, respectively. Then the total output of T3 node may be written as $\beta=[\beta_{e,0}, \beta_{o,0}, \beta_{e,1}, \beta_{o,1}, \beta_{e,2}, \beta_{o,2}, \beta_{e,3}, \beta_{o,3}]$. The output of the T3 node is thus an alternated concatenation of the first and second vectors.

T4 Nodes

For a node vector $d_0=[0, 0, 0, 1, \ldots, 1]$ mapping the leaf nodes of the node $N_o$, the node $N_o$ is named "Type 4", or simply "T4". This node consists of a repetition node on the bottom-left side and the rest of its child nodes are Rate1 nodes. A decoding algorithm of the T3 node first decodes the REP node on the left using the decoding algorithm of the REP node, and further partitions the descendant nodes of the T3 node into 4 independent SPC nodes that are decoded in parallel.

For example, with node size $N_S=16$ and the matrix $\alpha_o$ at the top of the node being a 4×16 matrix given as:

$$\alpha_o =$$

$$\begin{matrix} 0 \\ 1 \\ 2 \\ 3 \end{matrix} \begin{bmatrix} 0 & 11 & 15 & 27 & 20 & 13 & 0 & 27 & 20 & 13 & 0 & 27 & 0 & 11 & 15 & 27 \\ 4 & 1 & 15 & 24 & 15 & 8 & 15 & 0 & 15 & 8 & 15 & 0 & 4 & 1 & 15 & 24 \\ 18 & 0 & 0 & 7 & 34 & 0 & 0 & 7 & 34 & 0 & 0 & 7 & 18 & 0 & 0 & 7 \\ 25 & 10 & 9 & 0 & 0 & 20 & 9 & 18 & 0 & 20 & 9 & 18 & 25 & 10 & 9 & 0 \end{bmatrix},$$

it should be noted that the T4 node include a REP node of size 4 on the left side of the binary tree. In order to decode the T4 node, the REP node of size 4 on the bottom left is firstly decoded. In other words, a 4×4 matrix α2 is calculated following the SC decoding routine described herein above and then the REP node is decoded following the REP decoding routine described herein above.

Let the output of REP node be the vector $\beta_2=[z, z, z, z]$ where z is a symbol from GF(4). Then the T4 node can be decomposed into 4 SPC equations between the symbol indexes that differ by 4, i.e., symbols (0, 4, 8, 12), (1, 5, 9, 13), (2, 6, 10, 14) and (3, 7, 11, 15). Therefore, noting the symbols of $\beta$ by $s_i$, relations between the symbols of $\beta$ may be noted as follows:

$s_0+s_4+s_8+s_{12}=z$ $s_1+s_5+s_9+s_{13}=z$ $s_2+s_6+s_{10}+s_{14}=z$ $s_3+s_7+s_{11}+s_{15}=z$

These four equations may be solved separately and in parallel based on the SPC decoding routine explained before. The only difference is that z is equal to zero in SPC nodes, while z may be 0, 1, 2 or 3 (i.e. all members of GF(4)) in the T4 node.

T5 Nodes

For a node vector $d_0=[0, \ldots, 0, 0, 0, 1, 1, 1]$ mapping the leaf nodes of the node $N_o$, the node $N_o$ is named "Type 5", or simply "T5". LLR vectors of symbols whose indexes differ by a multiple of 8 are added which results in 8 LLR vectors. These LLRs may be used to successively decode a REP node and SPC node that are child nodes of the T5 node. Finally, the estimated symbols are repeated at indexes that differ by a multiple of 8 to yield the output of a T5 node.

Figure 15:
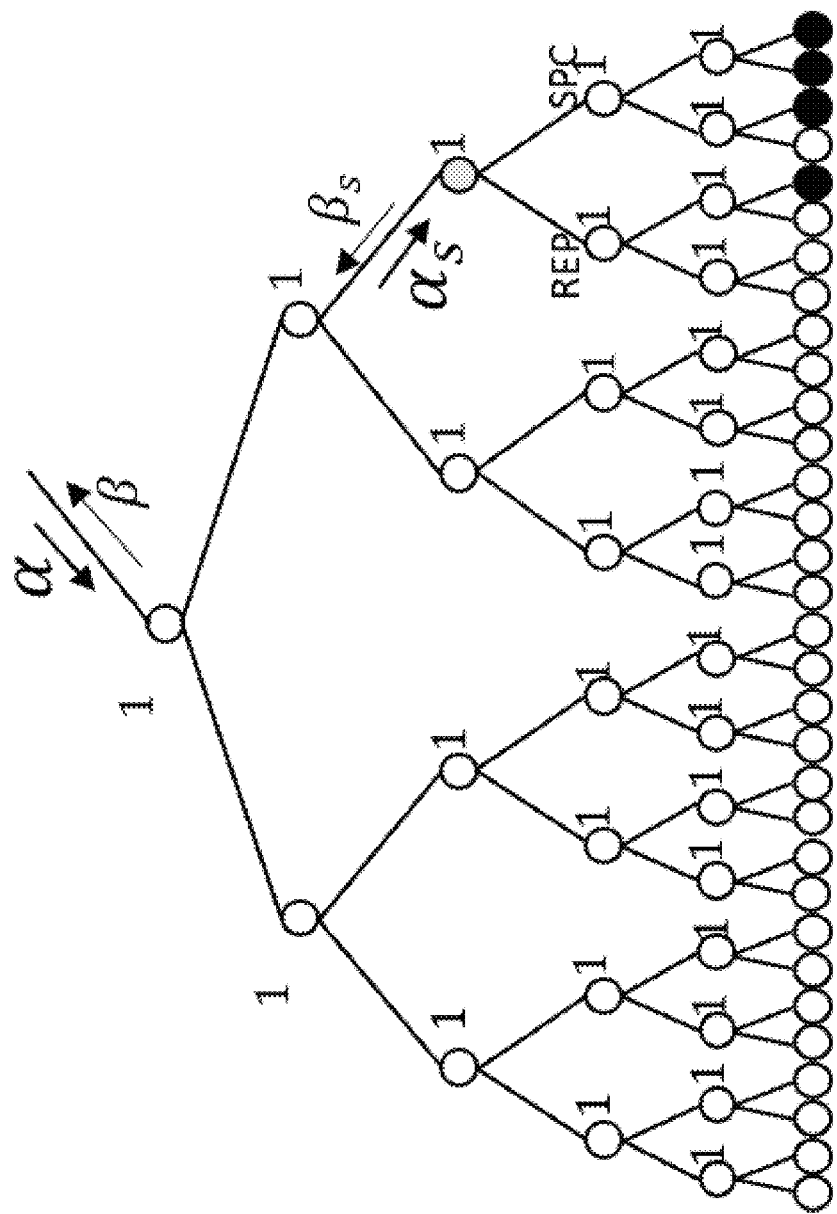
FIG. 15 is a graphical representation of a binary tree including a Type 5 special node.

For example and with reference to FIG. 15, with node size $N_S=32$ and the matrix $\alpha$ at the top of the node being a 4×32 matrix, a soft matrix $\alpha_s$ at an input of a source node is calculated. In an implementation, the source node is the parent node of an SPC node corresponding to the three "1" of the vector d. More specifically, the source node is a combination of a REP node and of an SPC node. Suppose the output of this source node is $\beta_s=[s_0, s_1, \ldots, s_7]$, then the output of T5 node may be written as $\beta=[s_0, s_1, \ldots, s_7, s_0, s_1, \ldots, s_7, s_0, s_1, \ldots, s_7, s_0, s_1, \ldots, s_7]$.

The 4×8 matrix $\alpha_s$ may further be calculated by adding the columns of a whose indexes differ by steps of 8. For example, the result of adding columns 0, 8, 16 and 24 is the first column in $\alpha_s$. After obtaining as, the REP and SPC nodes can be decoded successively and then the output of Type5 node can be obtained based on the symbols of $\beta_s$.

EG-PC Nodes

Figure 16:
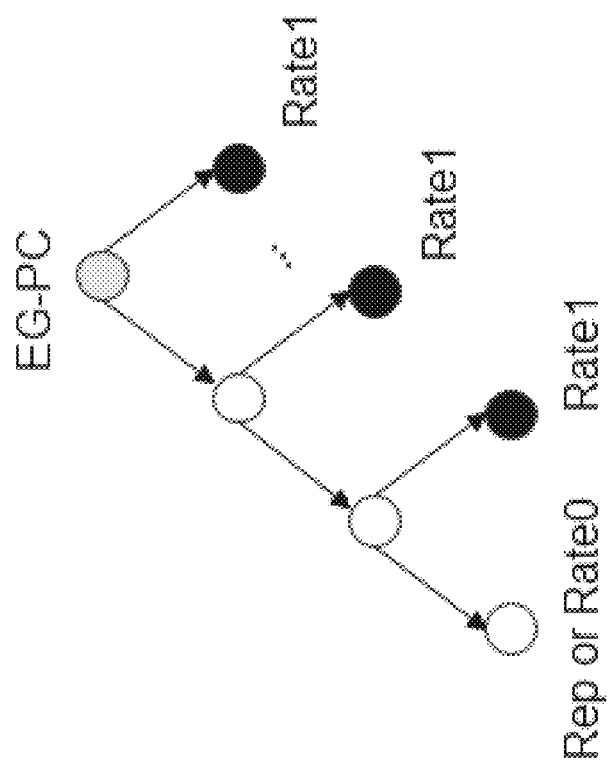
FIG. 16 is a graphical representation of a binary tree including an Extended Generalized Parity Check special node.

The node $N_o$ is named "Extended Generalized Parity Check", or simply "EG-PC" in response to having a REP/Rate0 of size $n_r$ on the bottom-left side and the rest of its child nodes are Rate1 nodes. An illustrative implementation of a EG-PC node is shown on FIG. 16. After decoding the REP or Rate0 node on the left, the subnodes of this special node can be partitioned into $n_r$ independent non-binary SPC nodes that can be decoded in parallel. This node is a generalization of T4.

In other words, EG-PC node is the generalization of T4 node that was described herein above. There are two differences between EG-PC and T4 nodes. In an EG-PC node, a node at the bottom left corner can be REP or Rate0, and the size of the node at the bottom left corner can be 4, 8, or any other multiples of 2, while in T4 the size of the REP node is 4. The size of the node on the bottom left determines the indexes of symbols that make SPC equations. Let the size of the bottom left node that is a REP or Rate-O node be denoted by $n_r$. Then the EG-PC node can be decomposed into $n_r$ SPC equation between the symbol indexes that differ by $n_r$. These $n_r$ equations may be solved separately and in parallel based on the SPC decoding routine described herein after. It is noted that if the bottom left node is a Rate0 node, then z is equal to zero, while for REP node it can be any member from GF(4).

G-REP Nodes

The node $N_o$ is named "Generalized Repetition", or simply "G-REP" in response to having a number of Rate0 nodes on the left and a source node (which can be any type of node) of size $n_r$ on the bottom-right side. Decoding this node is similar to T2 node. First the LLRs at the input of source node are computed as:

$$\alpha'_{k,j} = \sum_{k' \bmod n_r = k} \alpha_{k',j}$$

Then the output codeword of the source node is repeated $N_s/n_r$ times to obtain the output of a G-REP node. With a node size of $N_s$, the dimension of $\alpha_s$ is $4 \times n_s$ and the columns of $\alpha_s$ are obtained by adding the columns of $\alpha$ whose indexes differ by steps of $n_s$. After calculation of $\alpha_s$, the decoding of the source node can be performed (depending on its type can be done by one of the above mentioned decoding routine) and then based on $\beta_s$ the output of G-REP node is calculated.

Simulation Results

Figure 8:
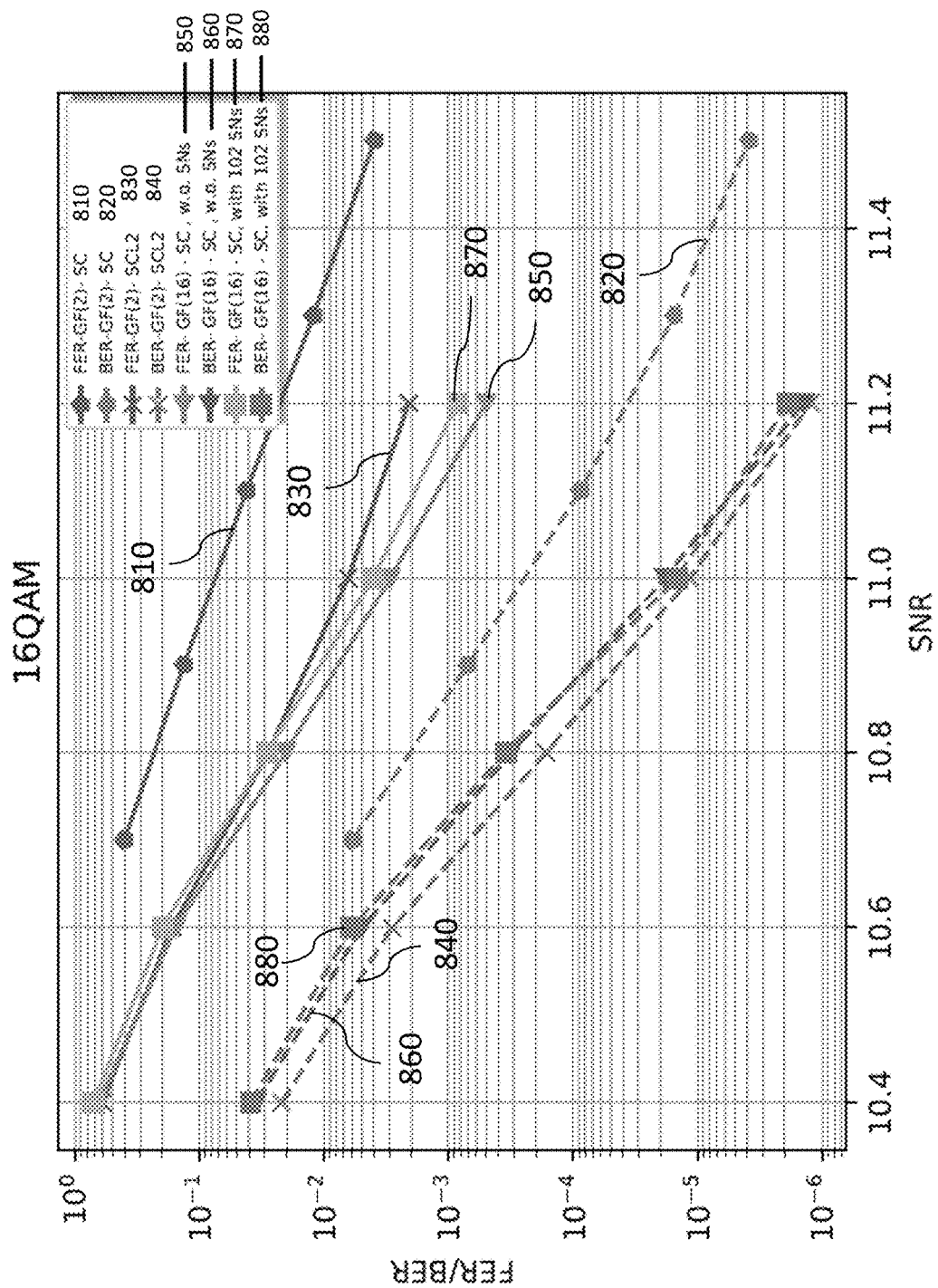
FIG. 8 is a chart showing simulation results for error rate performance of the binary polar code (BPC) and non-binary polar code (NBPC) using fast-successive cancellation (SC) and SC decoding routines in accordance with some non-limiting implementations of the present technology.

FIG. 8 is a chart showing simulation results for error rate performance (frame error rate (FER) or bit error rate (BER)) as a function of signal to noise ratio (SNR)) of the BPC and NBPC using fast-SC and SC decoder in bit interleaved coded modulation (BICM) scheme with 16QAM constellation. The dashed curves represent BER values, and the solid curves represent FER values. Lines 810 and 820 respectively represent FER and BER values of SC decoding of a binary polar code (i.e., GF(2)). Lines 830 and 840 respectively represent FER and BER values of SCL decoding of a binary polar code with list size L=2. Lines 850 and 860 respectively represent FER and BER values of non-binary polar constructed in GF(16) and decoded without identification of special nodes. Lines 870 and 880 respectively represent FER and BER values of non-binary polar constructed in GF(16) and decoded with the fast SC decoder proposed herein by identification of the special nodes. In this illustrative example, a total number of special nodes (leaf nodes after trimming the binary tree) is 102.

It can be seen that the error rate performance of NBPC using SC decoding is similar to the performance of BPC with SC list decoding (L=2). Moreover, the BER curve of NBPC using special nodes are overlapped with the BER curve of NBPC without special nodes. This is while there is a slight gap between the FER curves of NBPC with special nodes and without them. The reason for such gap is the suboptimal decoding of SPC nodes as we chose to have a low-complexity and hardware-friendly decoding for SPC nodes. Broadly speaking, achieving a specific BER or FER value with a smaller SNR value represent better performance of the decoding. For example, FIG. 8 shows at BER of 1e-5, the non-binary polar in GF(16) with SC decoding is about 0.35 dB to 0.4 dB more accurate than binary polar decoded by SC decoder.

In one aspect, the present technology provides application-specific hardware devices for executing decoding routines for binary trees and special nodes thereof. A given application-specific hardware device may include memory units (e.g. Random-Access Memory (RAM) units) and computing units for decoding received encoded non-binary data symbols. An example of an application-specific hardware device is described in greater details herein after.

Figure 9:
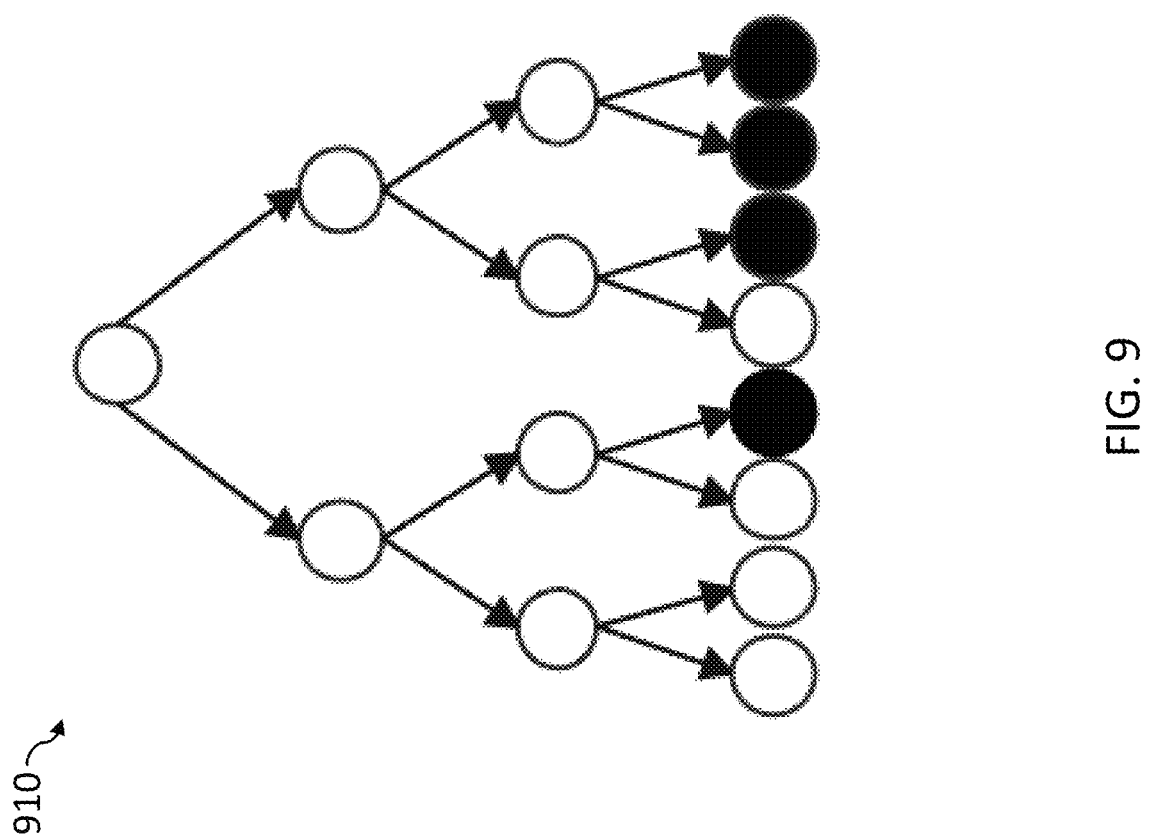
FIG. 9 is a graphical representation of a binary tree in accordance with some non-limiting implementations of the present technology.
Figure 10:
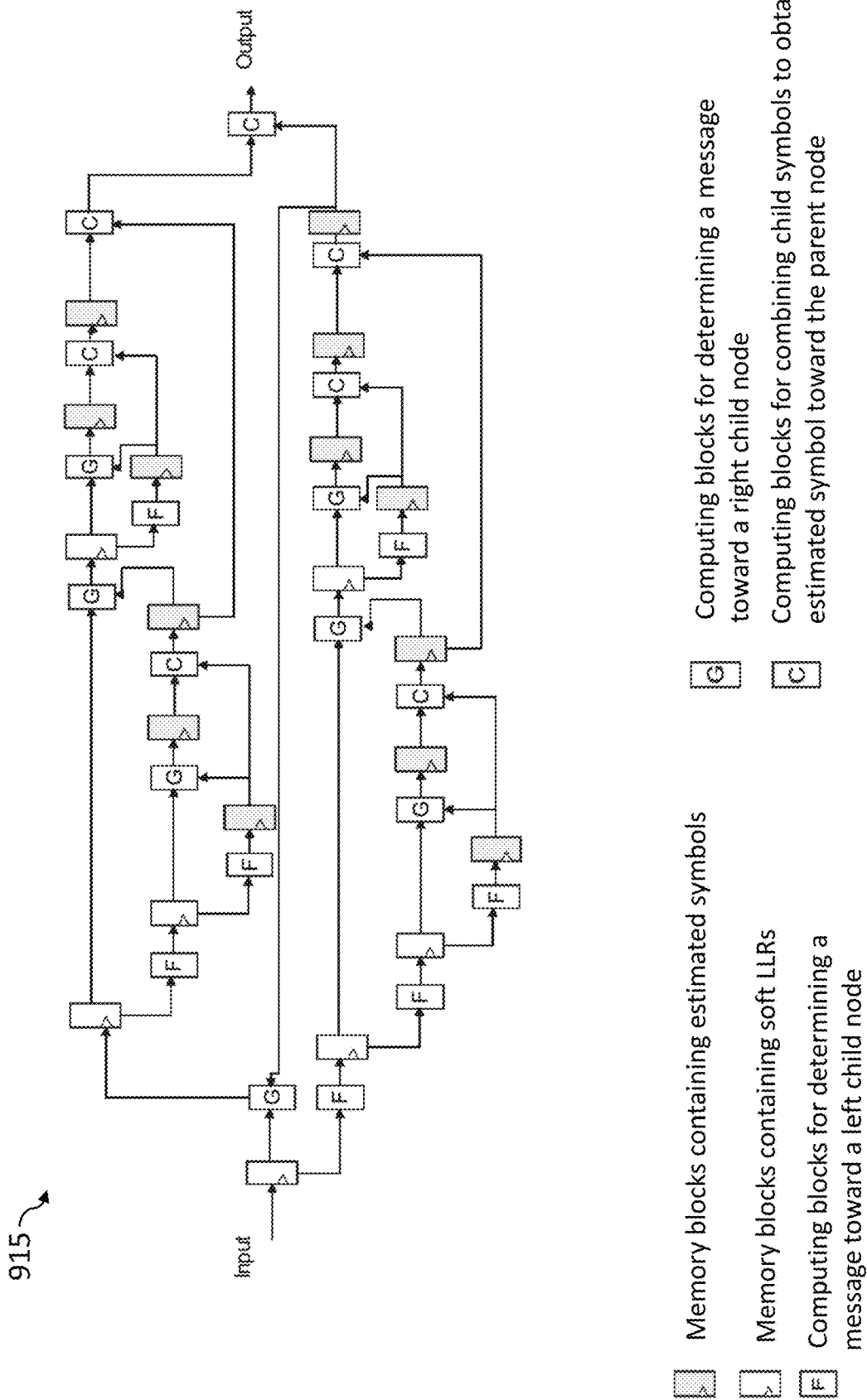
FIG. 10 is a schematic representation of an application-specific hardware device for decoding non-binary data symbols using the binary tree of FIG. 9 in accordance with some non-limiting implementations of the present technology.

FIG. 9 is a representation of a binary tree 910 including 4 levels, and FIG. 10 is an illustrative implementation of an application-specific hardware device 915 for decoding received encoded non-binary data symbols through the binary tree 910. Specific purposes of computing blocks and memory blocks of the application-specific hardware device 915 are described in FIG. 10.

Figure 11:
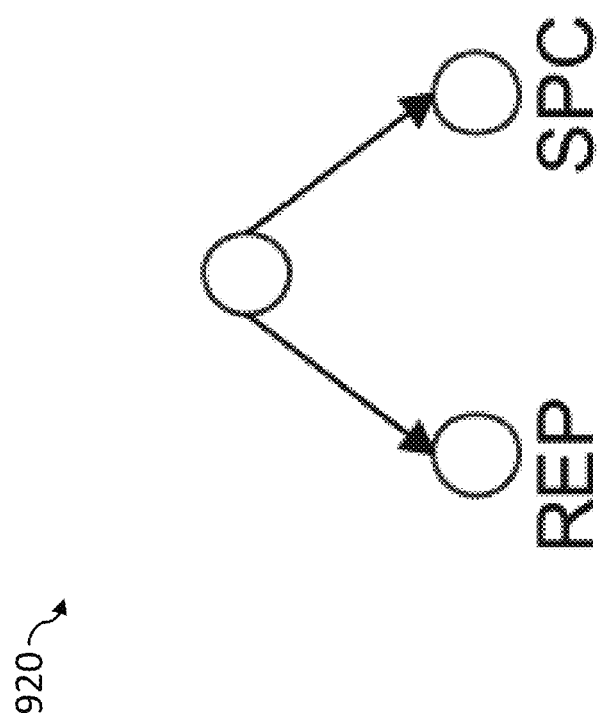
FIG. 11 is a graphical representation of a binary tree in accordance with some non-limiting implementations of the present technology.
Figure 12:
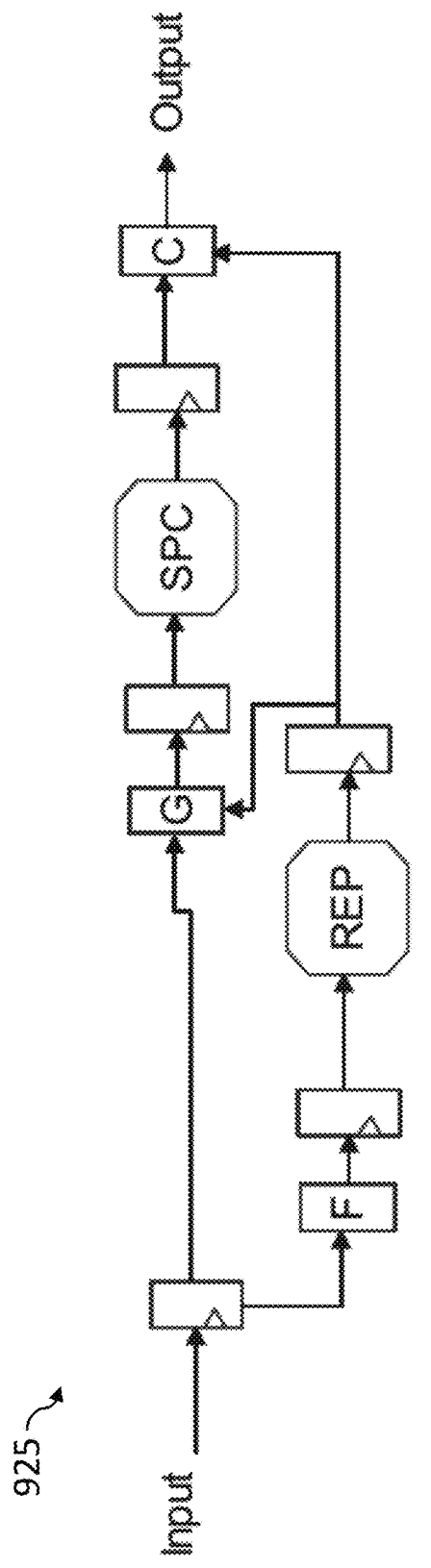
FIG. 12 is a schematic representation of an application-specific hardware device for decoding non-binary data symbols using the binary tree of FIG. 11 in accordance with some non-limiting implementations of the present technology.

In comparison, FIG. 11 is a representation of a binary tree 920, the binary tree 920 being a trimmed version of the binary tree 910 using definitions of the special nodes described herein above. FIG. 12 is an illustrative implementation of an application-specific hardware device 925 for decoding received encoded non-binary data symbols through the binary tree 920. Specific purposes of computing blocks and memory blocks of the application-specific hardware device 925 are described in FIG. 12. The blocks denoted "SPC" and "REP" in FIG. 12 are computing blocks that execute the decoding routines for SPC nodes and REP nodes respectively, said decoding routines being described herein above.

As can be seen with respect to FIGS. 10 and 12, the number of memory units and computing units is drastically reduced in the application-specific hardware device 925, which provides reduced footprint, faster computing calculations, and cheaper implementation to decode the received encoded non-binary data symbols.

Broadly speaking, the present technology may thus lower latency of decoding processes in real applications such as Fiber optical communications and 5G. In addition to the definition of special nodes, there is proposed a simplified structure for NBPCs with specific decoding routines for said special nodes.

In some implementations, the application-specific hardware device 925 is part of a Digital Signal Processor (DSP) chip of an encoding/decoding system or any electronic device used for encoding and/or decoding non-binary symbols. In the same or other implementations, the application-specific hardware device 925 is part of a forward error correction code (FEC) block of the encoding/decoding system or the electronic device.

Figure 13:
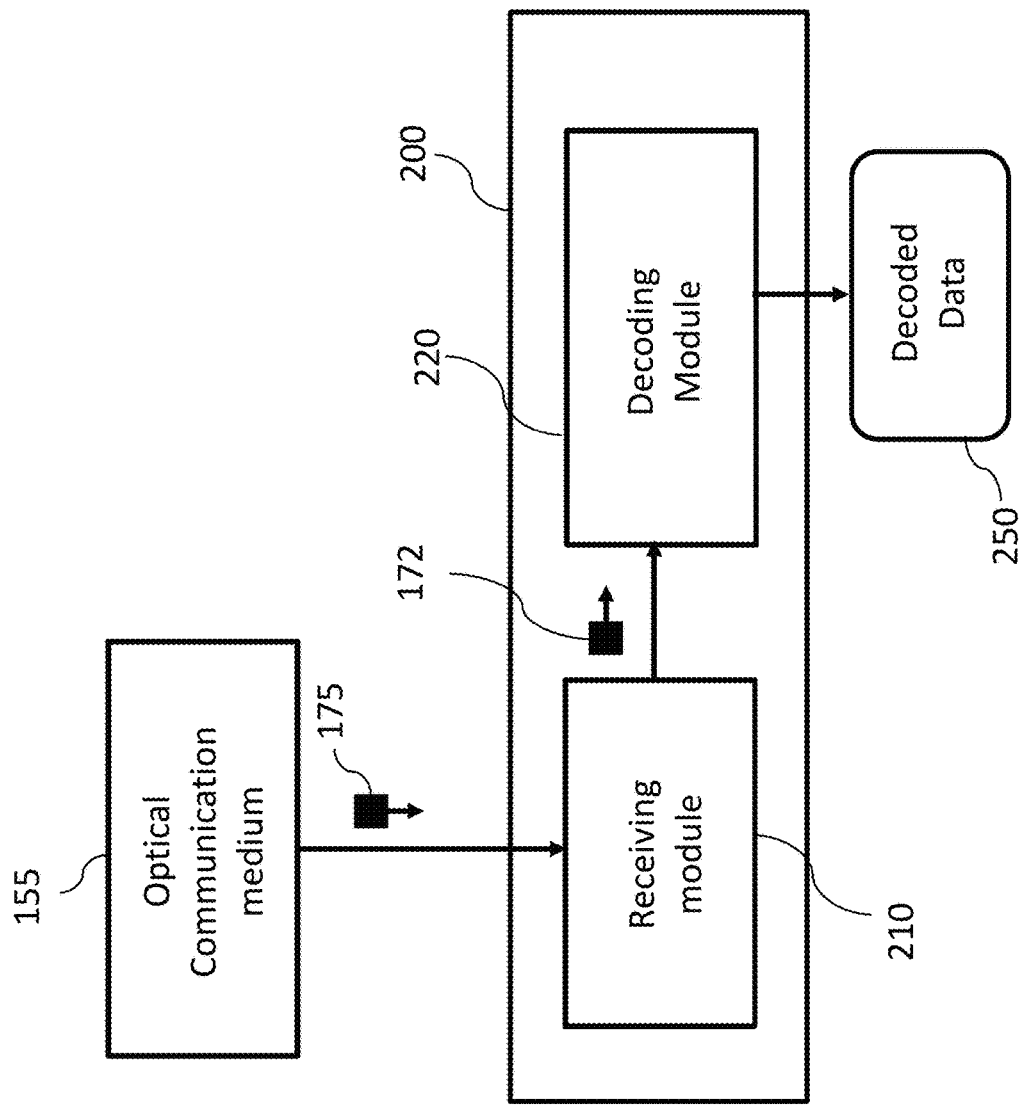
FIG. 13 is a block-diagram of a system configured to decode data comprising a plurality of encoded non-binary data symbols in accordance with some non-limiting embodiments of the present technology.

FIG. 13 is a block diagram illustrating a system 200 configured to receive and decode encoded non-binary data symbols. The system 200 is communicably connected to a communication medium 155 for receiving the encoded non-binary data symbols therefrom, and includes a receiving module 210 and a decoding module 220 for outputting decoded data 250. However, it should be understood that in some embodiments of the present technology, the system 200 may be implemented with additional, fewer, and/or different components to those illustrated in FIG. 13. For example, the system 200 may be embodied as an optical communication system (e.g., optical transceiver) enabling communication of moderate-rate large-length codes over the communication medium 155 or another optical communication medium. In a non-limiting implementation, the communication medium 155 is an optical communication medium such as an optical fiber. It is contemplated that the receiving module 210 may support optical termination and conversion of signals between electrical and optical domains, to provide for reception of encoded non-binary data symbols over the optical communication medium 155. For example and without limitation, the decoding module 220 may be implemented as the application-specific hardware device 925.

A structure and operation of each of these modules may depend on inter alia physical media and signaling mechanisms or protocols of components of the system 200 by which they are executed. In general, each component includes at least some sort of physical connection to a transfer medium, possibly in combination with other hardware and/or software-based elements, which will depend on inter alia a specific transfer media and/or specific mechanisms and/or specific implementations of the present technology.

Figure 14:
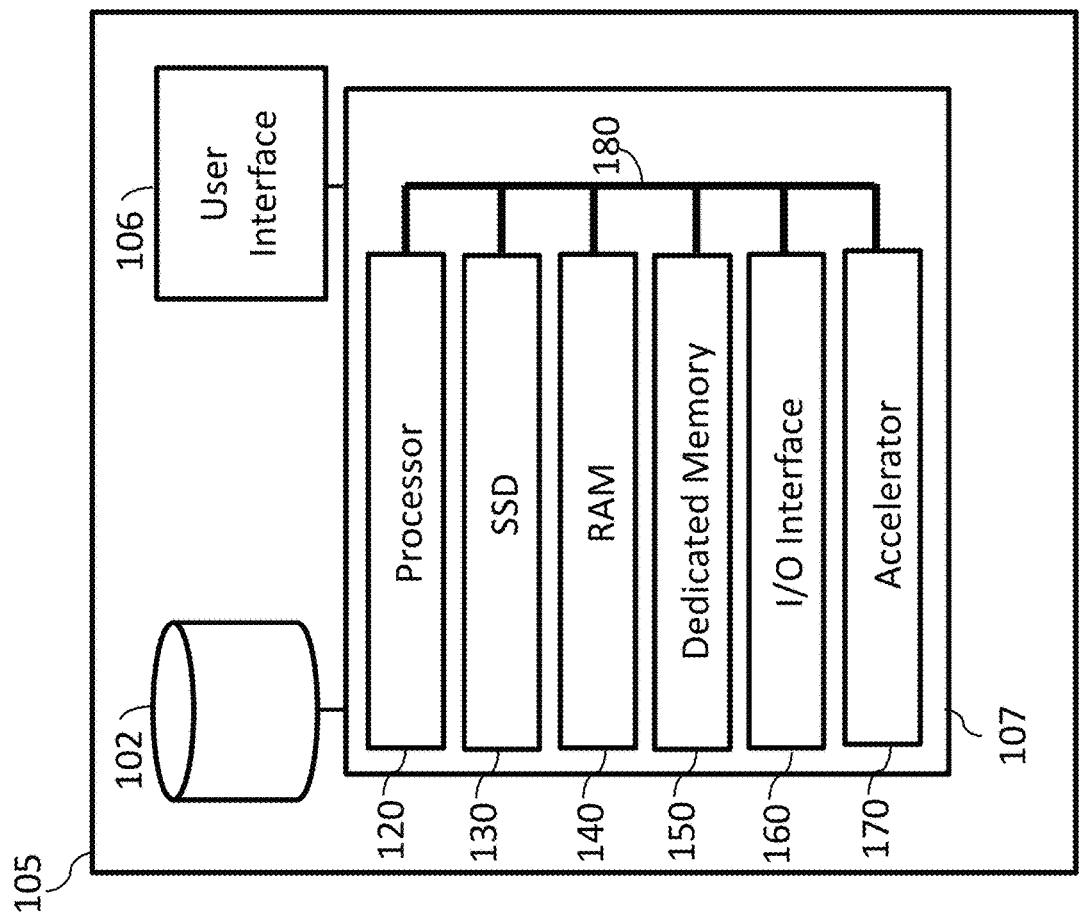
FIG. 14 is a block diagram of an electronic device in accordance with some non-limiting embodiments of the present technology.

With reference to FIG. 14, there is shown an electronic device 105 in accordance with non-limiting implementations of the present technology. In an embodiment, the system 200 is implemented as the electronic device 105, the electronic device 105 being suitable for executing all functions of the system 200, including the functions of the receiving module 210 and of the decoding module 220.

The electronic device 105 comprises a computing unit 107. In some implementations, the computing unit 107 may be implemented by any of a conventional personal computer, a controller, and/or an electronic device (e.g., a server, a controller unit, a control device, a monitoring device etc.) and/or any combination thereof appropriate to the relevant task at hand. In some embodiments, the computing unit 107 comprises various hardware components including one or more single or multi-core processors collectively represented by a processor 120, a solid-state drive 130, a RAM 140, a dedicated memory 150 and an input/output interface 160. The computing unit 107 may be a generic computer system.

In some other embodiments, the computing unit 107 may be an "off the shelf" generic computer system complemented by the addition of the application-specific hardware device 925. In some embodiments, the computing unit 107 may also be distributed amongst multiple systems. The computing unit 107 may also be specifically dedicated to the implementation of the present technology. As a person in the art of the present technology may appreciate, multiple variations as to how the computing unit 107 is implemented may be envisioned without departing from the scope of the present technology.

Communication between the various components of the computing unit 107 may be enabled by one or more internal and/or external buses 180 (e.g. a PCI bus, universal serial bus, IEEE 1394 "Firewire" bus, SCSI bus, Serial-ATA bus, ARINC bus, etc.), to which the various hardware components are electronically coupled.

The input/output interface 160 may provide networking capabilities such as wired or wireless access. As an example, the input/output interface 160 may comprise a networking interface such as, but not limited to, one or more network ports, one or more network sockets, one or more network interface controllers and the like. Multiple examples of how the networking interface may be implemented will become apparent to the person skilled in the art of the present technology. For example, but without being limitative, the networking interface may implement specific physical layer and data link layer standard such as Ethernet, Fibre Channel, Wi-Fi or Token Ring. The specific physical layer and the data link layer may provide a base for a full network protocol stack, allowing communication among small groups of computers on the same local area network (LAN) and large-scale network communications through routable protocols, such as Internet Protocol (IP).

According to implementations of the present technology, the solid-state drive 130 stores program instructions suitable for being loaded into the RAM 140 and executed by the processor 120. Although illustrated as a solid-state drive 130, any type of memory may be used in place of the solid-state drive 130, such as a hard disk, optical disk, and/or removable storage media.

The processor 120 may be a general-purpose processor, such as a central processing unit (CPU) or a processor dedicated to a specific purpose, such as a digital signal processor (DSP). In some embodiments, the processor 120 may also rely on an accelerator 170 dedicated to certain given tasks. For example, the accelerator 170 may be the application-specific hardware device 925. In some embodiments, the processor 120 or the accelerator 170 may be implemented as one or more field programmable gate arrays (FPGAs). Moreover, explicit use of the term "processor", should not be construed to refer exclusively to hardware capable of executing software, and may implicitly include, without limitation, application specific integrated circuit (ASIC), read-only memory (ROM) for storing software, RAM, and non-volatile storage. Other hardware, conventional and/or custom, may also be included.

Further, the electronic device 105 may include a Human-Machine Interface (HMI) 106. The HMI 106 may include a screen or a display capable of rendering an interface and indications of coded and/or decoded data, and/or any other information suitable for performing the routines and techniques described herein. In this embodiment, the display of the HMI 106 includes and/or be housed with a touchscreen to permit users to input data via some combination of virtual keyboards, icons, menus, or other Graphical User Interfaces (GUIs). The HMI 106 may thus be referred to as a user interface 106. In some embodiments, the display of the user interface 106 may be implemented using a Liquid Crystal Display (LCD) display or a Light Emitting Diode (LED) display, such as an Organic LED (OLED) display. The device may be, for example and without being limitative, a handheld computer, a personal digital assistant, a cellular phone, a network device, a smartphone, a navigation device, an e-mail device, a game console, or a combination of two or more of these data processing devices or other data processing devices. The user interface 106 may be embedded in the electronic device 105 as in the illustrated embodiment of FIG. 14 or located in an external physical location accessible to the user. For example, the user may communicate with the computing unit 107 (i.e. send instructions thereto and receive information therefrom) by using the user interface 106 wirelessly connected to the computing unit 107. The computing unit 107 may communicate with the user interface 106 via a network (not shown) such as a Local Area Network (LAN) and/or a wireless connection such as a Wireless Local Area Network (WLAN).

The electronic device 105 may comprise a memory 102 communicably connected to the computing unit 107 for storing received coded data and/or generated decoded data. The memory 102 may be embedded in the electronic device 105 as in the illustrated embodiment of FIG. 14 or located in an external physical location. The computing unit 107 may be configured to access a content of the memory 102 via a network (not shown) such as a Local Area Network (LAN) and/or a wireless connection such as a Wireless Local Area Network (WLAN).

Needless to say, the computing unit 107 may be implemented in any other suitable hardware, software, and/or firmware, or a combination thereof. In the depicted non-limiting embodiments of the present technology in FIG. 14, the computing unit 107 is a single component. In alternative non-limiting embodiments of the present technology, the functionality of the computing unit 107 may be distributed and may be implemented via multiple components.

Those skilled in the art will appreciate that processor 120 is generally representative of a processing capability that may be provided by, for example, a Central Processing Unit (CPU). In some embodiments, in place of or in addition to one or more conventional CPUs, one or more specialized processing cores may be provided. For example, one or more Graphic Processing Units (GPUs), Tensor Processing Units (TPUs), accelerated processors (or processing accelerators) and/or any other processing unit suitable for executing decoding protocols may be provided in addition to or in place of one or more CPUs. In alternative embodiments, the dedicated memory 140 may be a Random Access Memory (RAM), a Video Random Access Memory (VRAM), a Window Random Access Memory (WRAM), a Multibank Dynamic Random Access Memory (MDRAM), a Double Data Rate (DDR) memory, a Graphics Double Data Rate (GDDR) memory, a High Bandwidth Memory (HBM), a Fast-Cycle Random-Access Memory (FCRAM) or any other suitable type of computer memory.

While the above-described implementations have been described and shown with reference to particular operations performed in a particular order, it will be understood that these operations may be combined, sub-divided, or re-ordered without departing from the teachings of the present technology. At least some of the operations may be executed in parallel or in series. Accordingly, the order and grouping of the operations is not a limitation of the present technology.

Those of ordinary skill in the art will realize that the descriptions of various embodiments are illustrative only and are not intended to be in any way limiting. Other embodiments will readily suggest themselves to such persons with ordinary skill in the art having the benefit of the present disclosure. Furthermore, at least some of the disclosed embodiments may be customized to offer valuable solutions to existing needs and problems related to FEC solutions. In the interest of clarity, not all of the routine features of the implementations of the at least some of the disclosed embodiments are shown and described.

In particular, combinations of features are not limited to those presented in the foregoing description as combinations of elements listed in the appended claims form an integral part of the present disclosure. It will, of course, be appreciated that in the development of any such actual implementation of the at least some of the disclosed embodiments, numerous implementation-specific decisions may need to be made in order to achieve the developer's specific goals, such as compliance with application-, system-, and business-related constraints, and that these specific goals will vary from one implementation to another and from one developer to another. Moreover, it will be appreciated that a development effort might be complex and time-consuming, but would nevertheless be a routine undertaking of engineering for those of ordinary skill in the field of digital error correction having the benefit of the present disclosure.

In accordance with the present disclosure, the components, process operations, and/or data structures described in herein may be implemented using various types of operating systems, computing platforms, network devices, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used. Where a routine including a series of operations is implemented by a computer, a processor operatively connected to a memory, or a machine, those operations may be stored as a series of instructions readable by the machine, processor or computer, and may be stored on a non-transitory, tangible medium.

Systems and modules described herein may comprise software, firmware, hardware, or any combination(s) of software, firmware, or hardware suitable for the purposes described herein. Software and other modules may be executed by a processor and reside on a memory of servers, workstations, personal computers, computerized tablets, personal digital assistants (PDA), and other devices suitable for the purposes described herein. Software and other modules may be accessible via local memory, via a network, via a browser or other application or via other means suitable for the purposes described herein. Data structures described herein may comprise computer files, variables, programming arrays, programming structures, or any electronic information storage schemes, routine and techniques, or any combinations thereof, suitable for the purposes described herein.

It should be expressly understood that not all technical effects mentioned herein need to be enjoyed in each and every embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims

The invention claimed is:

1. An application-specific hardware device for decoding data, the data comprising a plurality of encoded non-binary data symbols, the application-specific hardware device being configured to:

receive the plurality of encoded non-binary data symbols, each encoded non-binary data symbol being received through a corresponding channel;

generate a plurality of log-likelihood ratio vectors by determining, for each encoded non-binary data symbol, a respective log-likelihood ratio vector;

apply a successive cancellation decoding routine to the plurality of log-likelihood ratio vectors, the successive cancellation decoding routine comprising one or more groups of operations, each of the one or more groups of operations being mapped as a node of a binary tree, wherein each node is associated with a calculation parameter used for performing operations of the corresponding group of operations, the one or more groups of operations to be applied to subsets of the plurality of log-likelihood ratio vectors, wherein each subset contains at least one of the plurality of log-likelihood ratio vectors;

use, at least in part, an output of a given group of operations as an input of a consecutive group of operations in the successive cancellation decoding routine; and generate a plurality of decoded non-binary data symbols based on an output of the one or more groups of operations of the successive cancellation decoding routine.

2. The application-specific hardware device of claim 1, wherein the one or more groups of operations comprise a plurality of groups of operations and subsets of the plurality of groups of operations are successively applied to the subsets of the plurality of log-likelihood ratio vectors.

3. The application-specific hardware device of claim 1, wherein the application-specific hardware device is further configured to perform a first iteration of the successive cancellation decoding routine by:

applying a first group of operations to the subsets of the plurality of log-likelihood ratio vectors, an execution of each operation of the first group of operations comprising:

executing a first permutation operation to a first log-likelihood ratio vector, the first permutation operation being defined based on a value of a first parameter to define a first permutated log-likelihood ratio vector;

determining a first output based on the first permutated log-likelihood ratio vector and a second log-likelihood ratio vector;

executing a second permutation operation to the first log-likelihood ratio vector to define a second permutated log-likelihood ratio vector, the second permutation operation being defined based on a value of the first parameter and on the first output;

determining a second output based on the first permutated log-likelihood ratio vector and the second permutated log-likelihood ratio vector.

4. The application-specific hardware device of claim 1, wherein the application-specific hardware device is further configured to perform a second iteration of the successive cancellation decoding routine by:

applying a second group of operations to outputs of a preceding group of operations, an execution of each operation of the second group of operations comprising:

executing a first permutation operation to a first output of the preceding group of operations in the successive cancellation decoding routine, the first permutation operation being defined based on a value of a first parameter to define a first permutated vector;

determining a first main output of the successive cancellation decoding routine based on the first permutated vector and a second output of the preceding group of operations;

executing a second permutation operation to the first output of the preceding group of operations to define a second permutated output, the second permutation operation being defined based on a value of the first parameter and on the first main output; and determining a second main output based on the second permutated vector and the second output of the preceding group of operations.

5. The application-specific hardware of claim 1, wherein the log-likelihood ratio vectors are elements of a Galois Field comprising $2^q$ elements, q being an integer corresponding to a number of bits mapped in each of the non-binary data symbols.

6. The application-specific hardware device of claim 1, wherein at least one operation of the one or more groups of operations comprises execution of an Extended Min-Sum (EMS) operation.

7. The application-specific hardware device of claim 1, wherein:

each node of the binary tree has a corresponding node size $N_s$ and receives a corresponding input matrix as an input, columns of the corresponding input matrix correspond to the log-likelihood ratio vectors affected by operations of a preceding group of operations, each leaf node of the binary tree corresponds to one channel of a plurality of corresponding channels.

8. The application-specific hardware device of claim 7, wherein the plurality of corresponding channels comprise a pre-determined set of information channels, and the application-specific hardware device is further configured to:

identify one or more pre-determined decoding routine to be executed on the binary tree.

9. The application-specific hardware device of claim 8, further configured to:

identify a given node of the binary tree having its leaf nodes representable as a vector d=[a, . . . , a] wherein each of the corresponding channels are represented as "b" for information channels and "a" otherwise; and execute a pre-determined decoding routine for the given node by setting an output of the given node to an all-zero vector with size $N_s$.

10. The application-specific hardware device of claim 8, further configured to:

identify a given node of the binary tree having its leaf nodes representable as a vector d=[b, . . . , b] wherein each of the corresponding channels are represented as "b" for information channels and "a" otherwise; and execute a pre-determined decoding routine for the given node by outputting vector of $N_s$ symbols whose corresponding log-likelihood ratio vectors in each column of the corresponding input matrix is zero.

11. The application-specific hardware device of claim 10, further configured to:

identify a given node of the binary tree having its leaf nodes representable as a vector d=[a, . . . , a, b] wherein each of the corresponding channels are represented as "b" for information channels and "a" otherwise; and execute a pre-determined decoding routine for the given node by:

summing the columns of the corresponding input matrix to obtain a sum vector;

selecting a non-binary data symbol corresponding to a minimum element of the sum vector, an output of the third special node being a $N_s$ repetition of the selected non-binary data symbol.

12. The application-specific hardware device of claim 10, further configured to:
    identify a given node of the binary tree having its leaf nodes representable as a vector d=[a, b, . . . , b] wherein each of the corresponding channels are represented as "b" for information channels and "a" otherwise; and
    execute a pre-determined decoding routine for the given node by:
        generating a vector of $N_s$ non-binary data symbols whose corresponding log-likelihood ratio vectors in each column of the corresponding input matrix is zero; and
        in response to the vector of $N_s$ non-binary data symbols satisfying a parity check equation based on GF($2^q$) addition,
            setting the vector of $N_s$ non-binary data symbols as an output of the node, and
            replacing each non-binary data symbol starting with a non-binary data symbol that satisfies the parity check equation from a first non-binary data symbol otherwise.

13. The application-specific hardware device of claim 10, further configured to:
    identify a given node of the binary tree having its leaf nodes representable as a vector d=[a, . . . a, b, b] wherein each of the corresponding channels are represented as "b" for information channels and "a" otherwise; and
    execute a pre-determined decoding routine for the given node by:
        summing the columns having even indexes of the corresponding input matrix to obtain a first sum vector;
        selecting a first non-binary data symbol corresponding to a minimum element of the first sum vector;
        summing the columns having odd indexes of the corresponding input matrix to obtain a second sum vector;
        selecting a second non-binary data symbol corresponding to a minimum element of the second sum vector;
        an output of the node being a $N_s$ repetition of a concatenation of the first and second non-binary data symbols.

14. The application-specific hardware device of claim 10, further configured to:
    identify a given node of the binary tree having its leaf nodes representable as a vector d=[a, . . . , a, b, b, b] wherein each of the corresponding channels are represented as "b" for information channels and "a" otherwise; and
    execute a pre-determined decoding routine for the given node by:
        determining a second matrix with $$\alpha'_{k,j} = \sum_{k' \bmod 4 = k} \alpha_{k',j}$$

where $\alpha_{k',j}$ are the coefficient of the input matrix;
        generating a vector of $N_s$ non-binary data symbols whose corresponding log-likelihood ratio vectors in each column of the second matrix is zero; and
        in response to the vector of $N_s$ non-binary data symbols satisfying a parity check equation based on GF($2^q$) addition,
            setting the vector of $N_s$ non-binary data symbols as an output of the node, and
            replacing each non-binary data symbol starting with a non-binary data symbol that satisfies the parity check from a first non-binary data symbol otherwise.

15. The application-specific hardware device of claim 10, further configured to:
    identify a given node of the binary tree having its leaf nodes representable as a vector d=[a, a, b, . . . , b] wherein each of the corresponding channels are represented as "b" for information channels and "a" otherwise; and
    execute a pre-determined decoding routine for the given node by:
        generating a first vector of $N_s/2$ non-binary data symbols whose corresponding log-likelihood ratio vectors in each column having an even index of the corresponding input matrix is zero; and
        in response to the first vector of not satisfying a parity check equation based on GF($2^q$) addition, replacing each non-binary data symbol starting with a non-binary data symbol that satisfies the parity check from a first non-binary data symbol,
        generating a second vector of $N_s/2$ non-binary data symbols whose corresponding log-likelihood ratio vectors in each column having an odd index of the corresponding input matrix is zero; and
        in response to the second vector of not satisfying a parity check equation based on GF($2^q$) addition, replacing each non-binary data symbol starting with a non-binary data symbol that satisfies the parity check,
        an output of the node being an alternated concatenation of the first and second vectors.

16. The application-specific hardware device of claim 10, further configured to:
    identify a given node of the binary tree having its leaf nodes representable as a vector d=[a, a, a, b, . . . , b] wherein each of the corresponding channels are represented as "b" for information channels and "a" otherwise; and
    execute a pre-determined decoding routine for the given node by:
        summing the columns of the corresponding input matrix to obtain a sum vector;
        selecting a first non-binary data symbol corresponding to a minimum element of the sum vector;
        generating a vector of $N_s-1$ non-binary data symbols whose corresponding log-likelihood ratio vectors in each column of the corresponding input matrix is zero; and
        in response to the vector not satisfying a parity check equation based on GF($2^q$) addition, replacing each non-binary data symbol starting with a non-binary data symbol that satisfies the parity check,
        an output of the node being a concatenation of the vector and the first non-binary data symbol.

17. The application-specific hardware device of claim 10, further configured to:
    identify a given node of the binary tree having its leaf nodes representable as a vector d=[a, . . . , a, a, a, b, a, b, b, b] wherein each of the corresponding channels are represented as "b" for information channels and "a" otherwise; and execute a pre-determined decoding routine for the given node by:

summing columns of the input matrix whose indexes differ by a multiple of 8 to define eight LLR output vectors;

an output of the node being a concatenation of repetitions of the eight LLR output vectors.

18. The application-specific hardware device of claim 10, further configured to:

identify a given node of the binary tree having its leaf nodes representable as a vector d=[a, . . . , a, b, . . . , b] comprising n, "a", wherein the channels are represented as "b" for information channels and "a" otherwise; and execute a pre-determined decoding routine for the given node by:

determining a set of $n_r$ equations;

solving the $n_r$ equations in parallel by, for each equation:

generating a vector of $N_s/n_r$ non-binary data symbols whose corresponding log-likelihood ratio vectors in each column of the corresponding input matrix is zero; and in response to the vector of $N_s/n_r$ non-binary data symbols satisfying a parity check equation based on $GF(2^q)$ addition, setting the vector of $N_s/n_r$ non-binary symbols as an output of the node, and replacing each non-binary data symbol starting with a non-binary data symbol that satisfies the parity check equation from a first non-binary data symbol otherwise.

19. The application-specific hardware device of claim 1, wherein the calculation parameters of nodes of a same level of the binary tree are equal.

* * * * *

UNITED STATES PATENT AND TRADEMARK OFFICE
CERTIFICATE OF CORRECTION

| | |
|---|---|
| PATENT NO. | : 12,107,605 B1 |
| APPLICATION NO. | : 18/126798 |
| DATED | : October 1, 2024 |
| INVENTOR(S) | : Farsiabi et al. |

It is certified that error appears in the above-identified patent and that said Letters Patent is hereby corrected as shown below:

In the Specification

In Column 9, Line 14, the expression "...a output..." should read "...an output...".

In Column 9, Line 48, the expression "...their correspond pre-defined operation..." should read "...their corresponding pre-defined operation...".

In Column 15, Line 18, the expression "...a EG-PC node..." should read "...an EG-PC node...".

Signed and Sealed this
Twenty-sixth Day of November, 2024

Katherine Kelly Vidal
*Director of the United States Patent and Trademark Office*